(12) United States Patent
Kim et al.

(10) Patent No.: US 11,800,776 B2
(45) Date of Patent: Oct. 24, 2023

(54) DISPLAY APPARATUS WITH CRACK DETECTION

(71) Applicant: Samsung Display Co., Ltd., Yongin-si (KR)

(72) Inventors: Minjeong Kim, Yongin-si (KR); Hyungjun Park, Yongin-si (KR); Junyong An, Yongin-si (KR); Nuree Um, Yongin-si (KR); Wonkyu Kwak, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 102 days.

(21) Appl. No.: 17/504,245

(22) Filed: Oct. 18, 2021

(65) Prior Publication Data

US 2022/0271102 A1 Aug. 25, 2022

(30) Foreign Application Priority Data

Feb. 19, 2021 (KR) ........................ 10-2021-0022597

(51) Int. Cl.
*H01L 23/58* (2006.01)
*H10K 59/88* (2023.01)
(Continued)

(52) U.S. Cl.
CPC ......... *H10K 59/88* (2023.02); *H10K 59/1213* (2023.02); *H10K 59/131* (2023.02);
(Continued)

(58) Field of Classification Search
CPC .. H10K 59/88; H10K 59/1213; H10K 59/131; H10K 59/00; H10K 71/70;
(Continued)

(56) References Cited

U.S. PATENT DOCUMENTS 9,466,810 B2 10/2016 Lee et al.
9,614,183 B2 4/2017 Zhang et al.
(Continued)

FOREIGN PATENT DOCUMENTS

EP 3806076 4/2021
KR 10-2019-0007570 1/2019
(Continued)

*Primary Examiner* — Tan N Tran
(74) *Attorney, Agent, or Firm* — H.C. Park & Associates, PLC

(57) ABSTRACT

A display apparatus includes a first pad at one side of a substrate; a first semiconductor layer on the substrate; a first crack detection electrode interposed between the substrate and the first semiconductor layer, and including a first end portion at the one side and a second end portion at another side; a second crack detection electrode disposed on the first semiconductor layer, and including a first end portion located at the one side and a second end portion connected to the second end portion of the first crack detection electrode; and a first auxiliary electrode disposed on the second conductive layer, and including a first end portion connected (Continued)

to the second end portion of the first crack detection electrode and a second end portion electrically connected to the first pad.

27 Claims, 18 Drawing Sheets

(51) Int. Cl.
  *H10K 59/131* (2023.01)
  *H10K 59/121* (2023.01)
  *H01L 27/12* (2006.01)
  *H01L 29/786* (2006.01)

(52) U.S. Cl.
  CPC ........ *H01L 27/124* (2013.01); *H01L 27/1225* (2013.01); *H01L 27/1251* (2013.01); *H01L 29/7869* (2013.01); *H01L 29/78675* (2013.01)

(58) Field of Classification Search
  CPC . H10K 50/805; H01L 27/1225; H01L 27/124; H01L 27/1251; H01L 29/78675; H01L 29/7869; H01L 27/3276; H01L 27/3225; H01L 27/3223; H01L 27/3262; G09G 2330/12; G09G 3/3233; G09G 2300/0426; G09G 2380/02; G09G 3/006; G09G 3/3266; G09G 3/3275
  USPC .......................................................... 257/48
  See application file for complete search history.

(56) References Cited

U.S. PATENT DOCUMENTS

| | | | |
|---|---|---|---|
| 10,522,431 B2 * | 12/2019 | Kim | ................. H01L 22/34 |
| 10,997,881 B2 | 5/2021 | Shin et al. | |
| 2016/0322451 A1 | 11/2016 | Park | |
| 2019/0157607 A1 | 5/2019 | Kim et al. | |
| 2020/0073495 A1 | 3/2020 | Bok et al. | |
| 2020/0212132 A1 | 7/2020 | Kim et al. | |
| 2021/0248938 A1 | 8/2021 | Lee et al. | |

FOREIGN PATENT DOCUMENTS

| | | |
|---|---|---|
| KR | 10-2056678 | 12/2019 |
| KR | 10-2020-0027598 | 3/2020 |
| WO | 2019235823 | 12/2019 |

\* cited by examiner

DISPLAY APPARATUS WITH CRACK DETECTION

CROSS-REFERENCE TO RELATED APPLICATION

This application claims priority from and the benefit of Korean Patent Application No. 10-2021-0022597, filed on Feb. 19, 2021, which is hereby incorporated by reference for all purposes as if fully set forth herein.

BACKGROUND

Field

Embodiments of the invention relate generally to display apparatuses.

Discussion of the Background

Display apparatuses visually display data. Display apparatuses are used as a display in small products such as cell phones or the like, or may be used as a display in large products such as televisions or the like.

Such a display apparatus includes a substrate that is divided into a display area and a non-display area, and a gate line and a data line are insulated from each other in the display area. A plurality of pixel regions are defined in the display area, and pixels arranged in each of the plurality of pixel regions emit light by receiving electrical signals from the gate line and the data line which cross each other, to display an image to the outside. Each pixel region, or each of the pixel regions, includes a thin-film transistor and a pixel electrode electrically connected thereto, and an opposite electrode is commonly provided in the pixel regions. In the non-display area, various lines configured to transmit an electrical signal to the pixels in the display area, a gate driving unit, pads to which the data driving unit and a controller may be connected, or the like may be provided.

The usage of display apparatuses has diversified. Further, as display apparatuses have become thinner and lighter, the range of use thereof have steadily expanded. In particular, when display apparatuses are moved or handled, cracks may easily occur due to an external force. Through the cracks, moisture or oxygen introduced from the outside may reach an organic light-emitting diode in the display apparatus. In this case, the organic light-emitting diode may be easily oxidized, and as a result, the reliability thereof may deteriorate. Thus, studies on estimating and detecting an occurrence of cracks in display apparatuses have further gained importance, and research associated therewith has been actively conducted.

The above information disclosed in this Background section is only for understanding of the background of the inventive concepts, and, therefore, it may contain information that does not constitute prior art.

SUMMARY

One or more embodiments provide a display apparatus with an increased crack detection range. However, this is merely illustrative, and the scope of the inventive concepts are not limited thereto.

Additional features of the inventive concepts will be set forth in the description that follows, and in part will be apparent from the description, or may be learned by practice of the inventive concepts.

According to an embodiment, a display apparatus includes a substrate including a display area and a peripheral area outside the display area, a first pad at one side of the peripheral area, a first semiconductor layer disposed on the display area; a first conductive layer which is interposed between the substrate and the first semiconductor layer, and includes a first electrode on the display area, and a first crack detection electrode, the first crack detection electrode including a first end portion at the one side of the peripheral area and a second end portion at another side of the peripheral area, a second conductive layer which is disposed on the first semiconductor layer, and includes a second electrode at least partially overlapping the first semiconductor layer, and a second crack detection electrode, the second crack detection electrode including a first end portion located at the one side of the peripheral area and a second end portion connected to the second end portion of the first crack detection electrode, and a third conductive layer which is disposed on the second conductive layer, and includes a third electrode over the display area, and a first auxiliary electrode, the first auxiliary electrode including a first end portion connected to the second end portion of the first crack detection electrode and a second end portion electrically connected to the first pad.

The display apparatus may further include a first voltage line which is electrically connected to the first end portion of the first crack detection electrode and the first end portion of the second crack detection electrode.

The display apparatus may further include a second voltage line which is electrically connected to the first pad, a first data line and a second data line which are disposed on the display area and extend in a first direction, a first switch connected between the first voltage line and the first data line, and a second switch connected between the second voltage line and the second data line.

The first switch and the second switch may be simultaneously controlled.

The display apparatus may further include a first voltage line electrically connected to the first end portion of the first crack detection electrode, and a second voltage line electrically connected to the first end portion of the second crack detection electrode.

The display apparatus may further include a third voltage line electrically connected to the first pad, first to third data lines which are disposed on the display area and extend in a first direction, a first switch connected between the first voltage line and the first data line, a second switch connected between the second voltage line and the second data line, and a third switch connected between the third voltage line and the third data line.

The first switch, the second switch, and the third switch may be simultaneously controlled.

The display apparatus may further include a second pad electrically connected to the first end portion of the first crack detection electrode and the first end portion of the second crack detection electrode.

The display apparatus may further include a resistance measuring unit electrically connected to the first pad and the second pad.

The display apparatus may further include a second pad electrically connected to the first end portion of the first crack detection electrode, and a third pad electrically connected to the first end portion of the second crack detection electrode.

The first crack detection electrode may extend along one edge of the substrate in the peripheral area, the second crack detection electrode may extend along the one edge in the peripheral area, and the first auxiliary electrode may extend along the one edge in the peripheral area.

The second crack detection electrode may at least partially overlap the first crack detection electrode.

The display apparatus may further include a semiconductor pattern having a first conductive region, a channel region, and a second conductive region, a channel bottom electrode which overlaps the channel region, and is configured to receive a driving voltage, a gate electrode overlapping the channel region, an upper electrode overlapping the gate electrode, and a line electrode which is electrically connected to one of the first conductive region and the second conductive region, and the first semiconductor layer includes the semiconductor pattern, the first conductive layer includes the channel bottom electrode, the second conductive layer includes the gate electrode or the upper electrode, and the third conductive layer includes the line electrode.

The display apparatus may further include a second conductive layer which is disposed on the second conductive layer in the display area, and a fourth conductive layer which is interposed between the second semiconductor layer and the third conductive layer, and includes a fourth electrode overlapping a channel region of the second semiconductor layer, and a third crack detection electrode, the third crack detection electrode including a first end portion at the one side of the peripheral area and a second end portion connected to the second end portion of the first crack detection electrode and the first end portion of the first auxiliary electrode.

The display apparatus may further include a second pad electrically connected to the first end portion of the first crack detection electrode, the first end portion of the second crack detection electrode, and the first end portion of the third crack detection electrode.

The display apparatus may further include a second pad electrically connected to the first end portion of the first crack detection electrode, a third pad electrically connected to the first end portion of the second crack detection electrode, and a fourth pad electrically connected to the first end portion of the third crack detection electrode.

The first semiconductor layer may include a silicon semiconductor material, and the second semiconductor layer may include an oxide semiconductor material.

The first end portion of the first auxiliary electrode may be directly connected to the second end portion of the first crack detection electrode and the second end portion of the second crack detection electrode through contact plugs.

At least one of the first crack detection electrode and the second crack detection electrode may include a plurality of zigzag patterns which are connected to each other in series.

The display apparatus may further include a second pad which is disposed at the one side of the peripheral area, and the first conductive layer may further include a third crack detection electrode which includes a first end portion at the one side of the peripheral area and a second end portion adjacent to the second end portion of the first crack detection electrode on the other side of the peripheral area, the second conductive layer may further include a fourth crack detection electrode which includes a first end portion at the one side of the peripheral area and a second end portion connected to the second end portion of the third crack detection electrode, and the third conductive layer may further include a second auxiliary electrode which includes a first end portion connected to the second end portion of the third crack detection electrode and a second end portion electrically connected to the second pad.

Each of the first crack detection electrode, the second crack detection electrode, and the first auxiliary electrode may extend along one edge of the substrate, each of the third crack detection electrode, the fourth crack detection electrode, and the second auxiliary electrode may extend along another edge of the substrate, and the one edge of the substrate and the other edge of the substrate may be opposite to each other.

The display apparatus may further include a first voltage line electrically connected to the first end portion of the first crack detection electrode and the first end portion of the second crack detection electrode, and a second voltage line electrically connected to the first end portion of the third crack detection electrode and the first end portion of the fourth crack detection electrode.

The display apparatus may further include a third voltage line electrically connected to the first pad, a fourth voltage line electrically connected to the second pad, first to fourth data lines which are disposed on the display area and extend in a first direction, a first switch connected between the first voltage line and the first data line, a second switch connected between the second voltage line and the second data line, a third switch connected between the third voltage line and the third data line, and a fourth switch connected between the fourth voltage line and the fourth data line.

The first to fourth switches may be simultaneously controlled.

The display apparatus may further include a first voltage line electrically connected to the first end portion of the first crack detection electrode, a second voltage line electrically connected to the first end portion of the second crack detection electrode, a third voltage line electrically connected to the first end portion of the third crack detection electrode, and a fourth voltage line electrically connected to the first end portion of the fourth crack detection electrode.

The display apparatus may further include a fifth voltage line electrically connected to the first pad, a sixth voltage line electrically connected to the second pad, first to sixth data lines which are disposed on the display area and extend in a first direction, a first switch connected between the first voltage line and the first data line, a second switch connected between the second voltage line and the second data line, a third switch connected between the third voltage line and the third data line, a fourth switch connected between the fourth voltage line and the fourth data line, a fifth switch connected between the fifth voltage line and the fifth data line, and a sixth switch connected between the sixth voltage line and the sixth data line.

The first to sixth switches may be simultaneously controlled.

Aspects, features, and advantages other than those described above will become apparent from the following detailed description, claims, and drawings to implement embodiments.

This general and specific aspect may be carried out by using a system, a method, a computer program, or any combinations thereof.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
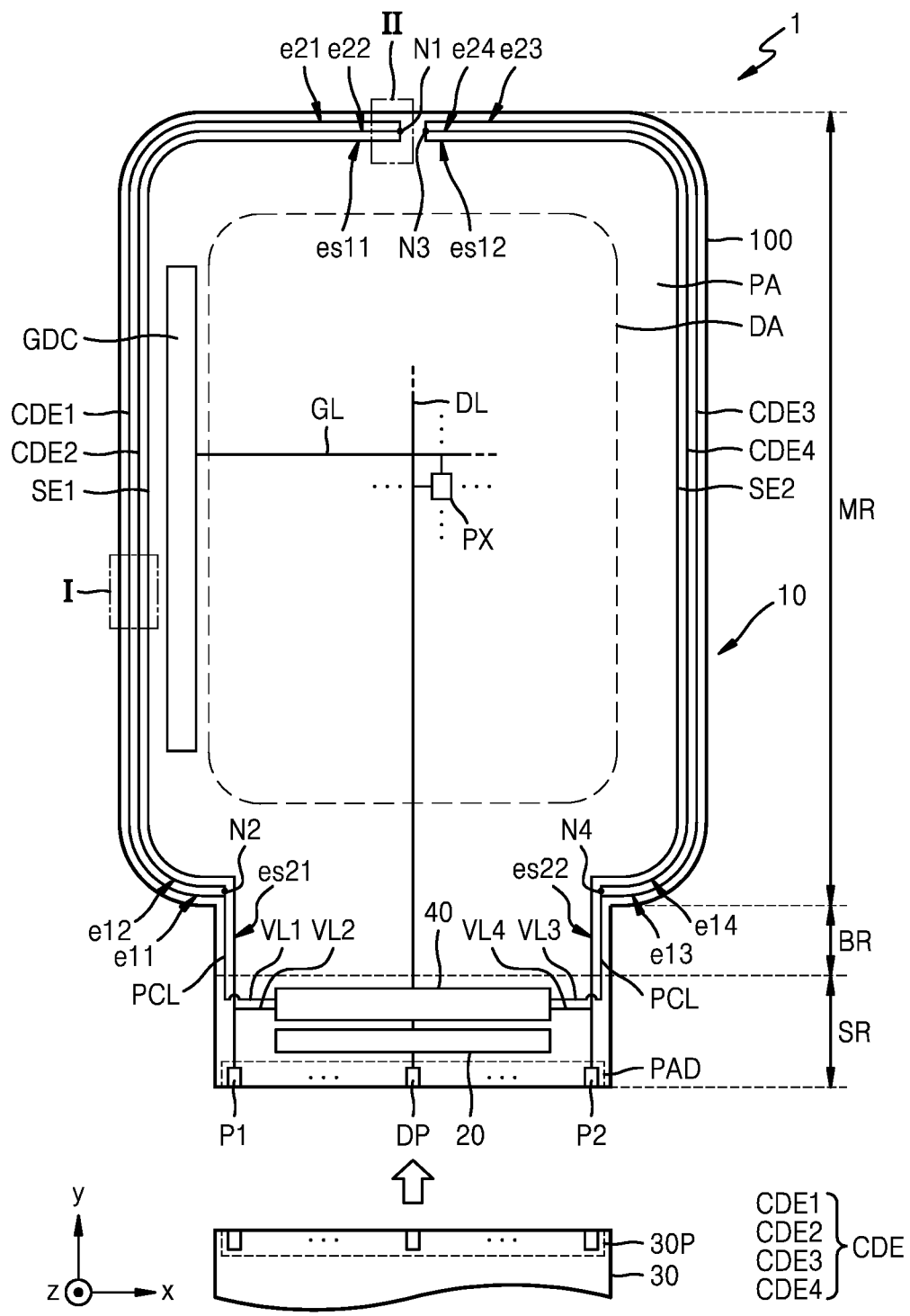
FIG. 1 is a plan view schematically illustrating a display apparatus according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are illustrated in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the inventive concepts. Further, the blocks, units, and/or modules of some embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Reference will now be made in detail to embodiments, examples of which are illustrated in the accompanying drawings, wherein like reference numerals refer to like elements throughout the inventive concepts. In this regard, the present embodiments may have different forms and configurations and should not be construed as being limited to the descriptions set forth herein. Accordingly, the embodiments are merely described below, by referring to the figures, to explain aspects of the inventive concepts.

The x-axis, the y-axis, and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another.

Figure 2:
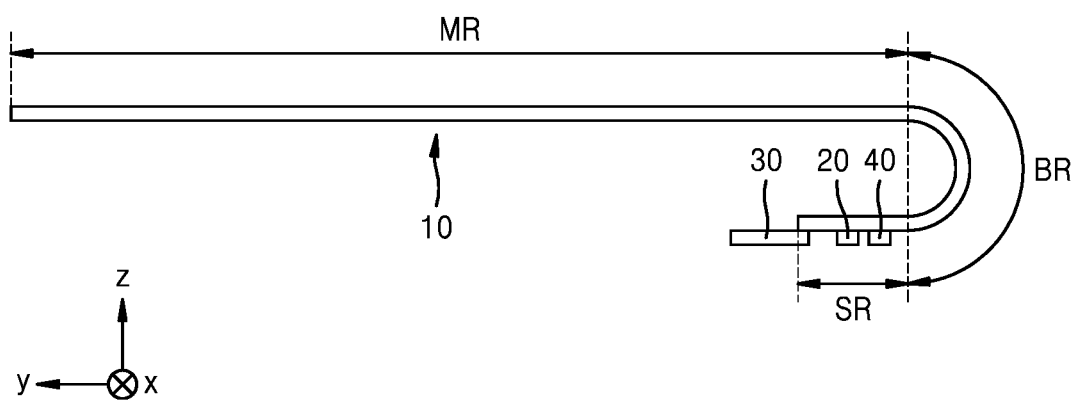
FIG. 2 is a side view schematically illustrating a display apparatus according to an embodiment.

FIG. 1 is a plan view schematically illustrating a display apparatus according to an embodiment, and FIG. 2 is a side view schematically illustrating a display apparatus according to an embodiment. The display apparatus according to the present embodiment is partially bent, but FIG. 1 illustrates that the display apparatus is not bent, for convenience of description.

Referring to FIG. 1, a display apparatus 1 includes a display panel 10. The display apparatus 1 may be any display apparatus so long as the display apparatus includes the display panel 10. For example, the display apparatus 1 may include various products such as smart phones, tablet personal computers (PCs), televisions, billboards, or the like.

The display panel 10 may include a display area DA and a peripheral area PA outside the display area DA. As illustrated in FIG. 1, the peripheral area PA may be arranged to surround the display area DA. Of course, because display panel 10 includes a substrate 100, FIG. 1 may be described in that the substrate 100 includes the display area DA and the peripheral area PA.

In addition, the display panel 10 may be described in that the display panel 10 includes a main region MR, a bending area BR outside the main region MR, and a sub-region SR at an opposite side of the main region MR with respect to the bending area BR. The sub-region SR may correspond to one side of the peripheral area PA. As illustrated in FIG. 2, the display panel 10 is bent in the bending area BR, and when viewed from a z direction, at least a portion of the sub-region SR may overlap the main region MR. However, one or more embodiments are not limited to the display apparatus 1 that is bendable, and may be applied to the display apparatus 1 that is not bendable. The sub-region SR may be a non-display area. The display panel 10 may be bent in the bending area BR, and thus, when the display apparatus 1 is viewed from a front surface thereof (in a −z direction), the non-display area may not be seen, or even when the non-display area is seen, an area that is seen may be minimized.

A driving chip 20 may be arranged in the sub-region SR of the display panel 10. The driving chip 20 may include an integrated circuit configured to drive the display panel 10. The integrated circuit may be a data driving integrated circuit configured to generate a data signal, but is not limited thereto.

The driving chip 20 may be mounted in the sub-region SR of the display panel 10. The driving chip 20 is mounted on a same surface as a display surface of the display area DA, but, as the display panel 10 is bent in the bending area BR as described above, the driving chip 20 may be located on a rear surface of the main region MR.

A printed circuit board 30 or the like may be attached to an end portion of the sub-region SR of the display panel 10. The printed circuit board 30 or the like may be electrically connected to the driving chip 20 or the like, through pads on the substrate. In FIG. 1, the driving chip 20 is arranged in the sub-region SR, but in another example, the driving chip 20 may be arranged on the printed circuit board 30.

An inspection circuit 40 may be arranged in the sub-region SR of the display panel 10. In FIG. 1, the inspection circuit 40 is arranged to be closer to the display area DA than the driving chip 20, but in another embodiment, the driving chip 20 may be arranged to be closer to the display area DA than the inspection circuit 40. In another embodiment, the driving chip 20 and the inspection circuit 40 may be arranged to overlap each other.

Figure 3:
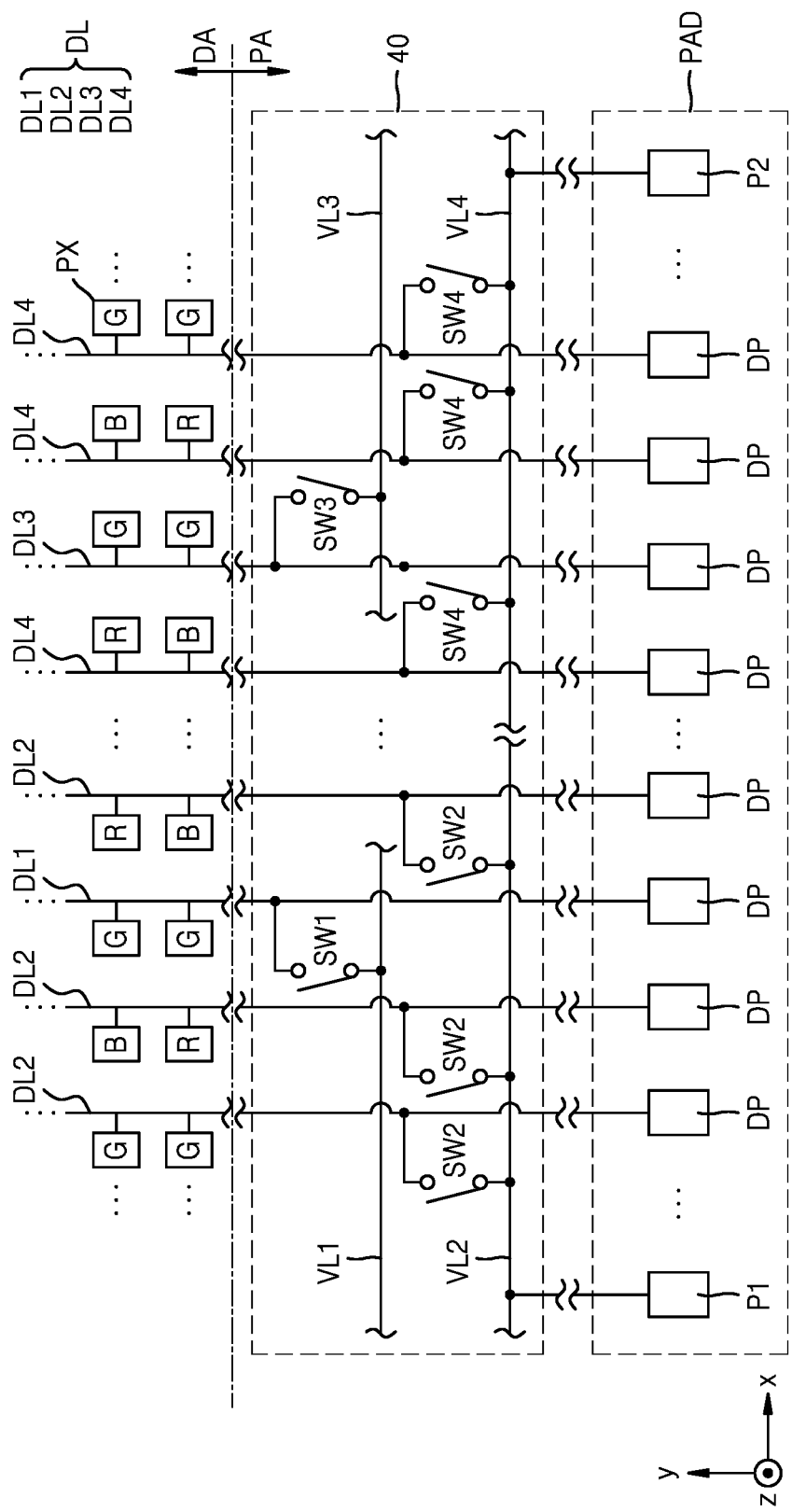
FIG. 3 is an enlarged plan view schematically illustrating a portion of the display apparatus of FIG. 1.

As illustrated in FIG. 3 to be described later, the inspection circuit 40 may include a plurality of voltage lines and a plurality of switches. The inspection circuit 40 may be electrically connected to a crack detection electrode CDE to be described later, and may inspect whether a crack has occurred by using an electrical signal (for example, a voltage value) transmitted from the crack detection electrode CDE.

For example, as illustrated in FIG. 1, the inspection circuit 40 may include a first voltage line VL1 and a second voltage line VL2. The first voltage line VL1 may be electrically connected to a first crack detection electrode CDE1 and a second crack detection electrode CDE2 to be described later, and the second voltage line VL2 may be electrically connected to a first pad P1 and a first auxiliary electrode SE1 to be described later. A signal received from the first pad P1 may be transmitted to the inspection circuit 40 via the first voltage line VL1 after passing through the first auxiliary electrode SE1, the first crack detection electrode CDE1, and the second crack detection electrode CDE2, or may be directly transmitted to the inspection circuit 40 via the second voltage line VL2. By comparing the signal received via the first voltage line VL1 with the signal received via the second voltage line VL2, crack detection may be detected.

The inspection circuit 40 may further include a third voltage line VL3 and a fourth voltage line VL4. The third voltage line VL3 may be electrically connected to a third crack detection electrode CDE3 and a fourth crack detection electrode CDE4 to will be described later, and the fourth voltage line VL4 may be electrically connected to a second pad P2 and a second auxiliary electrode SE2 to will be described later. A signal received from the second pad P2 may be transmitted to the inspection circuit 40 via the third voltage line VL3 after passing through the second auxiliary electrode SE2, the third detection electrode CDE3, and the fourth crack detection electrode CDE4, or may be directly transmitted to the inspection circuit 40 via the fourth voltage line VL4. By comparing the signal received via the third voltage line VL3 with the signal received via the fourth voltage line VL4, occurrence of one or more cracks may be detected.

In FIG. 1, the first crack detection electrode CDE1 and the second crack detection electrode CDE2 are connected to the first voltage line VL1, but embodiments are not limited thereto. In another embodiment, the first crack detection electrode CDE1 and the second crack detection electrode CDE2 may be connected to different voltage lines, respectively. Although descriptions are provided based on the first crack detection electrode CDE1 and the second crack detection electrode CDE2, the same descriptions may also be applied to the third crack detection electrode CDE3 and the fourth crack detection electrode CDE4. This will be described later with reference to FIG. 10.

In an embodiment, the inspection circuit 40 may be integrally formed as a single body with the display panel 10. For example, the inspection circuit 40 may be formed by using conductive layers and insulating layers in the display panel 10. In another embodiment, the inspection circuit 40 may be separately provided and mounted in the sub-region SR of the display panel 10 like the driving chip 20 or the printed circuit board 30.

Because the inspection circuit 40 is in the sub-region SR of the display panel 10, as the display panel 10 is bent in the bending area BR, the inspection circuit 40 may be located on a rear surface of the main region MR.

The display panel 10 includes the substrate 100. The substrate 100 may include glass, metal or a polymer resin. When the display panel 10 is bent in the bending area BR as described above, the substrate 100 may be flexible or bendable. In this case, the substrate 100 may include, for example, a polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate. However, the substrate 100 may also have a multilayer structure including two layers each including a polymer resin and a barrier layer between the two layers, including an inorganic material (such as silicon oxide, silicon nitride, silicon oxynitride, or the like), and various modifications may be made.

The display panel 10 may include a plurality of pixels PX in the display area DA, and each of the plurality of pixels PX may include a display element. In the inventive concepts, an organic light-emitting diode OLED is described as an example of the display element. Each of the pixels PX may be electrically connected to outer circuits arranged in the peripheral area PA. For example, a gate driving circuit GDC and a pad portion PAD may be arranged in the peripheral area PA.

The gate driving circuit GDC may be connected to gate lines GL that extend in a first direction (for example, a ±x direction). The gate lines GL may be respectively connected to pixels PX located in a same row, and may be configured to sequentially transmit an electrically signal.

The gate driving circuit GDC may include a scan driving circuit and an emission control driving circuit. The scan driving circuit included in the gate driving circuit GDC may be configured to transmit a scan signal to each of the pixels PX via a scan line. In addition, the emission control driving circuit included in the gate driving circuit GDC may be configured to transmit an emission control signal to each of the pixels PX via an emission control line.

In FIG. 1, the gate driving circuit GDC is arranged on a left side of the display panel 10, but in another embodiment, the gate driving circuit GDC may be arranged on a right side of the display panel 10. In another example, the gate driving circuit GDC may be provided in plural. The plurality of gate driving circuits GDC may be arranged on the left and right sides of the display panel 10 with the display area DA therebetween.

The pad portion PAD may be arranged at one side (for example, at a lower side or a lower end portion) of the peripheral area PA. For example, as illustrated in FIG. 1, the pad portion PAD may be arranged at an end portion of the sub-region SR of the display panel 10.

The pad portion PAD may be exposed by not being covered with an insulating layer, and electrically connected to the printed circuit board 30. A terminal portion 30P of the printed circuit board 30 may be electrically connected to the pad portion PAD of the display panel 10. The pad portion PAD may include a data pad DP, the first pad P1, and the second pad P2.

The data pad DP may be connected to a data line DL that extends in a second direction (for example, a ±y direction). The data line DL may be connected to pixels PX arranged in a same column, and may be configured to sequentially transmit an electrical signal. The data line DL may be connected to the driving chip 20. As described above, the driving chip 20 may be a data driving integrated circuit configured to generate a data signal, and the driving chip 20 may provide a data signal to each of the pixels PX via the data line DL.

Meanwhile, as illustrated in FIG. 3 to be described later, the data line DL may be connected to the inspection circuit 40 according to an operation of switches of the inspection circuit 40. For example, when the switches of the inspection circuit 40 are turned off, the data line DL and the inspection circuit 40 may be connected to each other, and a voltage transferred from the crack detection electrodes CDE may be applied to the data line DL.

The first pad P1 may be connected to the first auxiliary electrode SE1 to be described later. As described above, the first pad P1 may be electrically connected to the printed circuit board 30, and a signal transmitted from the printed circuit board 30 may be transmitted to the first auxiliary electrode SE1. In another example, the first pad P1 may be electrically connected to a separate circuit board for inspection before the printed circuit board 30 is attached. The first pad P1 may transmit a signal received from the circuit board for inspection to the first auxiliary electrode SE1.

Although descriptions are provided based on the first pad P1, the same descriptions may also be applied to the second pad P2. For example, the second pad P2 may be connected to the second auxiliary electrode SE2 to be described later. The second pad P2 may be electrically connected to the printed circuit board 30 or the circuit board for inspection, and may transmit a signal received from the printed circuit board 30 or the circuit board for inspection to the second auxiliary electrode SE2.

The crack detection electrodes CDE, the first auxiliary electrode SE1, and the second auxiliary electrode SE2 may be arranged in the peripheral area PA.

In the peripheral area PA, each of the crack detection electrodes CDE, the first auxiliary electrode SE1, and the second auxiliary electrode SE2 may extend along one edge of the display panel 10 and/or another edge of the display panel 10. In this case, the one edge and the other edge of the display panel 10 may be opposite to each other.

For example, as illustrated in FIG. 1, each of the first crack detection electrode CDE1, the second crack detection electrode CDE2, and the first auxiliary electrode SE1 may extend along the one side (for example, the left side) of the display panel 10, and each of the third crack detection electrode CDE3, the fourth crack detection electrode CDE4, and the second auxiliary electrode SE2 may extend along the edge of the other side (for example, the right side) of the display panel 10.

Each of the crack detection electrodes CDE may have an end portion that is electrically connected to the inspection circuit 40 arranged at one side (for example, at a lower side or a lower end portion) of the peripheral area PA, and an end portion located at another side (for example, an upper side or an upper end portion) of the peripheral area PA. Each of the first auxiliary electrode SE1 and the second auxiliary electrode SE2 may have an end portion that is electrically connected to the pad portion PAD arranged at one side (for example, the lower side or the lower end portion) of the peripheral area PA, and an end portion located at the other side (for example, the upper side or the upper end portion) of the peripheral area PA. The end portions located on the other side of the peripheral area PA may be connected to each other.

For example, as illustrated in FIG. 1, the first crack detection electrode CDE1 may have a first end portion e11 that is electrically connected to the first voltage line VL1 of the inspection circuit 40, and a second end portion e21 located at the other side of the peripheral area PA. The second crack detection electrode CDE2 may have a first end portion e12 that is electrically connected to the first voltage line VL1 of the inspection circuit 40, and a second end portion e22 located on the other side of the peripheral area PA. The first auxiliary electrode SE1 may have a first end portion es11 located at the other side of the peripheral area PA, and a second end portion es21 electrically connected to the first pad P1 of the pad portion PAD.

In this case, the second end portion e21 of the first crack detection electrode CDE1, the second end portion e22 of the second crack detection electrode CDE2, and the first end portion es11 of the first auxiliary electrode SE1 may be connected to one another at a first node N1. The first node N1 may be located at the other side of the peripheral area PA.

In FIG. 1, the first end portion e11 of the first crack detection electrode CDE1 and the first end portion e12 of the second crack detection electrode CDE2 are electrically connected to a same voltage line, that is, the first voltage line VL1, but in another embodiment, the first end portion e11 of the first crack detection electrode CDE1 and the first end portion e12 of the second crack detection electrode CDE2 may be electrically connected to different voltage lines, respectively. This will be described later with reference to FIG. 10.

In an embodiment, the first end portion e11 of the first crack detection electrode CDE1 and the first end portion e12 of the second crack detection electrode CDE2 may be connected to each other at a second node N2. In this case, a pad connection line PCL, which is connected to the second node N2, may connect the first crack detection electrode CDE1 and the second crack detection electrode CDE2 to the first voltage line VL1. In FIG. 1, the second node N2 is located in a corner portion of the peripheral area PA, but in another embodiment, the second node N2 may be located in the bending area BR or the sub-region SR. In another example, the second node N2 may be omitted, and the first end portion e11 of the first crack detection electrode CDE1 and the first end portion e12 of the second crack detection electrode CDE2 may be directly connected to the first voltage line VL1.

Through the first crack detection electrode CDE1, the second crack detection electrode CDE2, and the first auxiliary electrode SE1 arranged as described above, the system as described herein may estimate whether a defect occurs at one side (for example, the left side) of the display panel 10 and/or the display apparatus 1. For example, an electrical signal transmitted to the first pad P1 may first reach the first auxiliary electrode SE1 and the second voltage line VL2. Then, the electrical signal may reach the first end portion e11 of the first crack detection electrode CDE1, the first end portion e12 of the second crack detection electrode CDE2, and the first voltage line VL1 via the first end portion es11 of the first auxiliary electrode SE1, the second end portion e21 of the first crack detection electrode CDE1, and the second end portion e22 of the second crack detection electrode CDE2. Based on the electrical signal transmitted to the inspection circuit 40 via the first voltage line VL1 and the electrical signal transmitted to the inspection circuit 40 via the second voltage line VL2, the system may estimate whether a defect occurs in the display panel 10 and/or the display apparatus 1. In this case, the electrical signal may be a current and/or a voltage.

In an embodiment, the first crack detection electrode CDE1 and the second crack detection electrode CDE2 may be farther apart from the display area DA than the first auxiliary electrode SE1. The first auxiliary electrode SE1 may be arranged between the first crack detection electrode CDE1 and the display area DA and between the second crack detection electrode CDE2 and the display area DA.

As described above, the first crack detection electrode CDE1 and the second crack detection electrode CDE2 may be arranged at an outer periphery of the peripheral area PA, and may be disconnected by an impact applied to the display panel 10 and/or the display apparatus 1. When the first crack detection electrode CDE1 and/or the second crack detection electrode CDE2 are disconnected, an electrical signal transmitted via the first voltage line VL1 by passing through the first crack detection electrode CDE1 and/or the second crack detection electrode CDE2 may be different from an electrical signal transmitted via the second voltage line VL2. Thus, it may be estimated whether a defect occurs in the display panel 10 and/or the display apparatus 1.

Meanwhile, when the first crack detection electrode CDE1 and the second crack detection electrode CDE2 are arranged at the outer periphery of the peripheral area PA, a range of detecting a crack generated in the display panel 10 and/or the display apparatus 1 further increases compared to a case where only one of the first crack detection electrode CDE1 or the second crack detection electrode CDE2 is arranged. Thus, a crack generated in the display panel 10 and/or the display apparatus 1 may be accurately detected in a further wider range.

Descriptions are provided based on the first crack detection electrode CDE1, the second crack detection electrode CDE2, and the first auxiliary electrode SE1, which are arranged at one side (for example, the left side) of the display panel 10, but the same descriptions may also be applied to the third crack detection electrode CDE3, the fourth crack detection electrode CDE4, and the second auxiliary electrode SE2, which are arranged at the other side (for example, the right side) of the display panel 10.

In other words, the third crack detection electrode CDE3 may have a first end portion e13 that is electrically connected to the third voltage line VL3 of the inspection circuit 40, and a second end portion e23 located at the other side of the peripheral area PA. The fourth crack detection electrode CDE4 may have a first end portion e14 that is electrically connected to the third voltage line VL3 of the inspection circuit 40, and a second end portion e24 located at the other side of the peripheral area PA. The second auxiliary electrode SE2 may have a first end portion es12 that is located at the other side of the peripheral area PA, and a second end portion es22 that is electrically connected to the second pad P2 of the pad portion PAD.

In this case, the second end portion e23 of the third crack detection electrode CDE3, the second end portion e24 of the fourth crack detection electrode CDE4, and the first end portion es12 of the second auxiliary electrode SE2 may be connected to one another at a third node N3. The third node N3 may be located at the other side of the peripheral area PA. The first node N1 and the third node N3 may be adjacent to each other.

In FIG. 1, the first end portion e13 of the third crack detection electrode CDE3 and the first end portion e14 of the fourth crack detection electrode CDE4 are electrically connected to a same voltage line, that is, the third voltage line VL3, but embodiments are not limited thereto. In another embodiment, the first end portion e13 of the third crack detection electrode CDE3 and the first end portion e14 of the fourth crack detection electrode CDE4 may be electrically connected to different pads, respectively. This will be described later with reference to FIG. 10.

In an embodiment, the first end portion e13 of the third crack detection electrode CDE3 and the first end portion e14 of the fourth crack detection electrode CDE4 may be connected to each other at a fourth node N4. Here, the pad connection line PCL, which is connected to the fourth node N4, may connect the third crack detection electrode CDE3 and the fourth crack detection electrode CDE4 to the third voltage line VL3. In FIG. 1, the fourth node N4 is located in a corner portion of the peripheral area PA. In another embodiment, the fourth node N4 may be located in the bending area BR or the sub-region SR. In another example, the fourth node N4 may be omitted, and the first end portion e13 of the third crack detection electrode CDE3 and the first end portion e14 of the fourth crack detection electrode CDE4 may be directly connected to the third voltage line VL3.

Through the third crack detection electrode CDE3, the fourth crack detection electrode CDE4, and the second auxiliary electrode SE2 arranged as described above, the inspection circuit 40 may estimate whether a defect occurs at the other side (for example, the right side) of the display panel 10 and/or the display apparatus 1.

FIG. 3 is an enlarged plan view schematically illustrating a portion of the display apparatus 1 of FIG. 1.

Referring to FIG. 3, the display panel 10 may include the pad portion PAD and the inspection circuit 40. In FIG. 3, for convenience of description, some of the pixels PX arranged in the display panel 10 and some of the data lines DL are illustrated.

In an embodiment, the pixels PX may include a red pixel R emitting red light, a blue pixel B emitting blue light, and a green pixel G emitting green light. The red pixel R and the blue pixel B may be alternately arranged in a same column, and the green pixel G may be arranged in a row-wise manner in a column in which the red pixels R and the blue pixels B are not arranged. That is, the green pixels G may be arranged in one or more of the same rows in the x-direction as the red pixels R and blue pixels B, but the green pixels G may be disposed in different columns in the y-direction as the red pixels R and the blue pixels B. With respect to a column in which the green pixels G are arranged, a group of the red pixels R and a group of the blue pixels B may be separately located in a diagonal direction and arranged in a checker board pattern. In other words, each of the red pixels R and the blue pixels B may be alternately arranged so as not to be repeatedly arranged in a same column in two adjacent rows. In FIG. 3, the pixels PX include the red pixel R, the blue pixel B, and the green pixel G, but the pixels PX may further include a pixel of a color other than red, green, and blue.

The data lines DL may be arranged in each column. As described above with reference to FIG. 1, the data lines DL may be connected to the data pads DP of the pad portion PAD, respectively. Meanwhile, among the data lines DL, a data line connected to the first voltage line VL1 of the inspection circuit 40 may be referred to as a first data line DL1, a data line connected to the second voltage line VL2 of the inspection circuit 40 may be referred to as a second data line DL2, a data line connected to the third voltage line VL3 of the inspection circuit 40 may be referred to as a third data line DL3, and a data line connected to the fourth voltage line VL4 of the inspection circuit 40 may be referred to as a fourth data line DL4.

In FIG. 3, one first data line DL1 is connected to the first voltage line VL1, but in another embodiment, a plurality of first data lines DL1 may be connected to the first voltage line VL1. Descriptions are provided based on the first data line DL1, but the same descriptions may also be applied to the third data line DL3. In other words, a plurality of third data lines DL3 may be connected to the third voltage line VL3.

In addition, in FIG. 3, pixels PX connected to the first data line DL1 include the green pixel G, but in another embodiment, the pixels PX connected to the first data line DL1 may include the red pixel R and/or the blue pixel B. Descriptions are provided based on the first data line DL1, but the same descriptions may also be applied to the third data line DL3.

The inspection circuit 40 may include the first voltage line VL1, the second voltage line VL2, the third voltage line VL3, the fourth voltage line VL4, a first switch SW1, a second switch SW2, a third switch SW3, and a fourth switch SW4.

As described above with reference to FIG. 1, the first voltage line VL1 may be connected to the first crack detection electrode CDE1 and the second crack detection electrode CDE2, and the second voltage line VL2 may be connected to the first pad P1 and the first auxiliary electrode SE1. The third voltage line VL3 may be connected to the third crack detection electrode CDE3 and the fourth crack detection electrode CDE4, and the fourth voltage line VL4 may be connected to the second pad P2 and the second auxiliary electrode SE2.

As illustrated in FIG. 3, the second voltage line VL2 and the fourth voltage line VL4 are apart from each other and connected to the first pad P1 and the second pad P2, respectively, but embodiments are not limited thereto. In another embodiment, the second voltage line VL2 and the fourth voltage line VL4 may be connected to each other. In this case, one of the first pad P1 or the second pad P2 may be omitted.

The first switch SW1 may include a first terminal connected to the first voltage line VL1, and a second terminal connected to the first data line DL1. The first switch SW1 may be turned on (for example, switched off) according to a control signal, and connect the first voltage line VL1 and the first data line DL1 to each other.

The second switch SW2 may include a first terminal connected to the second voltage line VL2, and a second terminal connected to the second data line DL2. The second switch SW2 may be turned on according to a control signal and connect the second voltage line VL2 and the second data line DL2 to each other.

The third switch SW3 may include a first terminal connected to the third voltage line VL3, and a second terminal connected to the third data line DL3. The third switch SW3 may be turned on according to a control signal and connect the third voltage line VL3 and the third data line DL3 to each other.

The fourth switch SW4 may include a first terminal connected to the fourth voltage line VL4, and a second terminal connected to the fourth data line DL4. The fourth switch SW4 may be turned on according to a control signal and connect the fourth voltage line VL4 and the fourth data line DL4 to each other.

In an embodiment, the first switch SW1, the second switch SW2, the third switch SW3, and the fourth switch SW4 may be simultaneously controlled. In other words, the first switch SW1, the second switch SW2, the third switch SW3, and the fourth switch SW4 may be simultaneously turned on or off according to a same control signal. For example, while the printed circuit board 30 (see FIG. 1) is attached to the pad portion PAD and a data signal is transmitted to the data pad DP, the first switch SW1, the second switch SW2, the third switch SW3, and the fourth switch SW4 may be simultaneously turned off according to the same control signal.

Meanwhile, as described above with reference to FIG. 1, the first crack detection electrode CDE1 and the second crack detection electrode CDE2 may be arranged at an outer periphery of the peripheral area PA. An impact applied to the display panel 10 and/or the display apparatus 1 may disconnect the first crack detection electrode CDE1 and/or the second crack detection electrode CDE2 from the outer periphery of the peripheral area PA. An electrical signal received via the first voltage line VL1 by passing through the disconnected first crack detection electrode CDE1 and/or second crack detection electrode CDE2 may be different from an electrical signal received via the second voltage line VL2.

For example, an electrical signal received from the first pad P1 may include a black data voltage. When no crack occurs, the electrical signal received via the first voltage line VL1 by passing through the first crack detection electrode CDE1 and/or the second crack detection electrode CDE2 and the electrical signal received via the second voltage line VL2 may be a same voltage, that is, the black data voltage.

Accordingly, the first data line DL1 connected to the first voltage line VL1 receives the black data voltage via the first switch SW1, and pixels PX connected to the first data line DL1 receive the black data voltage, and thus, light is not emitted. In addition, the second data line DL2 connected to the second voltage line VL2 via the second switch SW2 receives the black data voltage, and pixels PX connected to the second data line DL2 receive the black data voltage, and thus, light is not emitted.

On the other hand, the first crack detection electrode CDE1 and/or the second crack detection electrode CDE2 are disconnected by the occurrence of crack, and an electrical signal received via the first voltage line VL1 may be higher or lower than the black data voltage. Thus, the first data line DL1 connected to the first voltage line VL1 via the first switch SW1 receives a voltage different from the black data voltage, and the pixels PX connected to the first data line DL1 emit light. Because the second data line DL2 still receives the black data voltage, the pixels PX connected to the second data line DL2 do not emit light. As described above, the inspection circuit 40 may identify whether a crack occurs based on whether the pixels PX connected to the first data line DL1 emit light.

Descriptions are provided based on the first crack detection electrode CDE1 and the second crack detection electrode CDE2 that are arranged at one side of the display panel 10, but the same descriptions may also be applied to the third crack detection electrode CDE3 and the fourth crack detection electrode CDE4 arranged at another side of the display panel 10.

Figure 4:
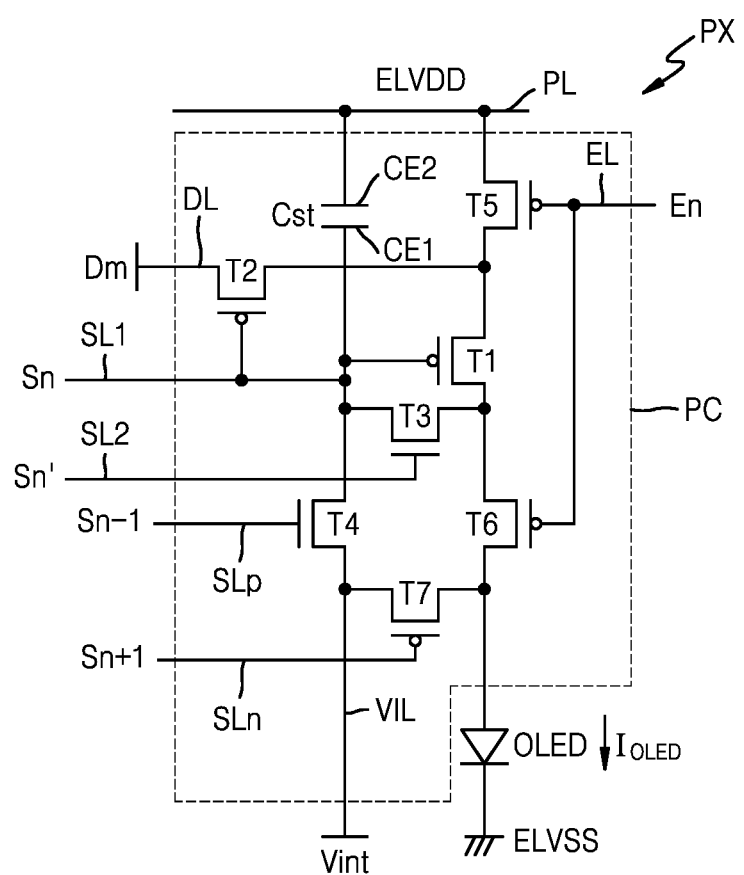
FIG. 4 is an equivalent circuit diagram schematically illustrating a pixel according to an embodiment.

FIG. 4 is an equivalent circuit diagram schematically illustrating a pixel according to an embodiment.

Referring to FIG. 4, one pixel PX may include a pixel circuit PC and a display element electrically connected to the pixel circuit PC. For example, the display element may be an organic light-emitting diode OLED.

As illustrated in FIG. 4, the pixel circuit PC may include a plurality of thin-film transistors T1 to T7 and a storage capacitor Cst. The thin-film transistors T1 to T7 and the storage capacitor Cst may be connected to signal lines SL1, SL2, SLp, SLn, EL, and DL, an initialization voltage line VIL, and a driving voltage line PL. In some embodiments, at least one of the signal lines SL1, SL2, SLp, SLn, EL, and DL, for example, the initialization voltage line VIL and/or the driving voltage line PL, may be shared with neighboring pixels PX.

The thin-film transistors may include a driving thin-film transistor T1, a scan thin-film transistor T2, a compensation thin-film transistor T3, a gate initialization thin-film transistor T4, an operation control thin-film transistor T5, an emission control thin-film transistor T6, and an anode initialization thin-film transistor T7.

Some of the plurality of thin-film transistors T1 to T7 may be provided as n-channel MOSFETs (NMOS), and the other ones may be provided as p-channel MOSFETs (PMOS).

For example, as illustrated in FIG. 4, among the plurality of thin-film transistors T1 to T7, the compensation thin-film transistor T3 and the gate initialization thin-film transistor T4 may be provided as NMOS, and the other transistors may be provided as PMOS.

In another embodiment, among the plurality of thin-film transistors T1 to T7, the compensation thin-film transistor T3, the gate initialization thin-film transistor T4, and the anode initialization thin-film transistor T7 may be provided as NMOS, and the other transistors may be provided as PMOS. In some embodiments, only one of the plurality of thin-film transistors T1 to T7 may be provided as NMOS, and the other ones may be provided as PMOS. In some embodiments, all of the plurality of thin-film transistors T1 to T7 may be provided as NMOS.

The signal lines include a first scan line SL1 configured to transmit a first scan signal Sn, a second scan line SL2 configured to transmit a second scan signal Sn', a previous scan line SLp configured to transmit a previous scan signal Sn−1 to the gate initialization thin-film transistor T4, an emission control line EL configured to transmit an emission control signal En to the operation control thin-film transistor T5 and the emission control thin-film transistor T6, a next scan line SLn configured to transmit a next scan signal Sn+1 to the anode initialization thin-film transistor T7, and the data line DL that crosses the scan line SL1 and is configured to transmit a data signal Dm.

The driving voltage line PL is configured to transfer a driving voltage ELVDD to the driving thin-film transistor T1, and the initialization voltage line VIL is configured to transfer an initialization voltage Vint configured to initialize the driving thin-film transistor T1 and an anode.

A gate of the driving thin-film transistor T1 may be connected to the storage capacitor Cst, a source of the driving thin-film transistor T1 may be connected to the driving voltage line PL via the operation control thin-film transistor T5, and a drain of the driving thin-film transistor T1 may be electrically connected to the anode of the organic light-emitting diode OLED via the emission control thin-film transistor T6. The driving thin-film transistor T1 receives the data signal Dm according to a switching operation of the scan thin-film transistor T2 to supply a driving current $I_{OLED}$ to the organic light-emitting diode OLED.

A gate of the scan thin-film transistor T2 is connected to the first scan line SL1, a source of the scan thin-film transistor T2 is connected to the data line DL, and a drain of the scan thin-film transistor T2 may be connected to the driving voltage line PL via the operation control thin-film transistor T5 while being connected to the source of the driving thin-film transistor T1. The scan thin-film transistor T2 may be turned on according to the first scan signal Sn received via the first scan line SL1, and perform a switching operation of transmitting the data signal Dm received via the data line DL to the source of the driving thin-film transistor T1.

A gate of the compensation thin-film transistor T3 is connected to the second scan line SL2. A drain of the compensation thin-film transistor T3 is connected to the drain of the driving thin-film transistor T1, and connected to the anode of the organic light-emitting diode OLED via the emission control thin-film transistor T6. A source of the compensation thin-film transistor T3 is connected to a lower electrode CE1 of the storage capacitor Cst and the gate of the driving thin-film transistor T1. In addition, the source of the compensation thin-film transistor T3 is connected to a drain of the gate initialization thin-film transistor T4.

The compensation thin-film transistor T3 is turned on according to the second scan signal Sn' received via the second scan line SL2, and electrically connects the gate and the drain of the driving thin-film transistor T1 to each other, to diode-connect the driving thin-film transistor T1.

A gate of the gate initialization thin-film transistor T4 is connected to the previous scan line SLp. A source of the gate initialization thin-film transistor T4 is connected to a source of the anode initialization thin-film transistor T7 and the initialization voltage line VIL. The drain of the gate initialization thin-film transistor T4 is connected to the lower electrode CE1 of the storage capacitor Cst, the source of the compensation thin-film transistor T3, and the gate of the driving thin-film transistor T1. The gate initialization thin-film transistor T4 is turned on according to the previous scan signal Sn−1 received via the previous scan line SLp and transfers the initialization voltage Vint to the gate of the driving thin-film transistor T1, to perform an initialization operation of initializing a voltage of the gate of the driving thin-film transistor T1.

A gate of the operation control thin-film transistor T5 is connected to the emission control line EL, a source of the operation control thin-film transistor T5 is connected to the driving voltage line PL, and a drain of the operation control thin-film transistor T5 is connected to the source of the driving thin-film transistor T1 and the drain of the scan thin-film transistor T2.

A gate of the emission control thin-film transistor T6 is connected to the emission control line EL, a source of the emission control thin-film transistor T6 is connected to the drain of the driving thin-film transistor T1 and the drain of the compensation thin-film transistor T3, and a drain of the emission control thin-film transistor T6 is electrically connected to a drain of the anode initialization thin-film transistor T7 and the anode of the organic light-emitting diode OLED.

The operation control thin-film transistor T5 and the emission control thin-film transistor T6 are simultaneously turned on according to the emission control signal En received via the emission control line EL, and the driving voltage ELVDD is transferred to the organic light-emitting diode OLED, and thus, the driving current $I_{OLED}$ flows in the organic light-emitting diode OLED.

A gate of the anode initialization thin-film transistor T7 is connected to the next scan line SLn, the drain of the anode initialization thin-film transistor T7 is connected to the drain of the emission control thin-film transistor T6 and the anode of the organic light-emitting diode OLED, and the source of the anode initialization thin-film transistor T7 is connected to the source of the gate initialization thin-film transistor T4 and the initialization voltage line VIL. The anode initialization thin-film transistor T7 is turned on according to the next scan signal Sn+1 received via the next scan line SLn and initializes the anode of the organic light-emitting diode OLED.

As illustrated in FIG. 4, the anode initialization thin-film transistor T7 may be connected to the next scan line SLn. In another embodiment, the anode initialization thin-film transistor T7 may be connected to the emission control line EL, and driven according to the emission control signal En. Meanwhile, positions of a source and drain of each of the thin-film transistors may be switched according to a type (p-type or n-type) of the transistor.

The storage capacitor Cst may include the lower electrode CE1 and an upper electrode CE2. The lower electrode CE1 of the storage capacitor Cst is connected to the gate of the driving thin-film transistor T1, and the upper electrode CE2 of the storage capacitor Cst is connected to the driving voltage line PL. The storage capacitor Cst may store a charge corresponding to a voltage difference between a gate voltage of the driving thin-film transistor T1 and the driving voltage ELVDD.

Specific operations of each of the pixels PX according to an embodiment are provided below.

During an initialization period, when the previous scan signal Sn−1 is transmitted via the previous scan line SLp, the gate initialization thin-film transistor T4 is turned on in correspondence with the previous scan signal Sn−1, and the driving thin-film transistor T1 is initialized by the initialization voltage Vint that is applied via the initialization voltage line VIL.

During a data programming period, when the first scan signal Sn and the second scan signal Sn' are transmitted via the first scan line SL1 and the second scan line SL2, respectively, the scan thin-film transistor T2 and the compensation thin-film transistor T3 are turned on in correspondence with the first scan signal Sn and the second scan signal Sn'. In this case, the driving thin-film transistor T1 is diode-connected by the compensation thin-film transistor T3 that is turned on, and is biased in a forward direction.

Then, a compensation voltage (Dm+Vth, where Vth is a negative value) obtained by subtracting the data signal Dm received via the data line DL by a threshold voltage (Vth) of the driving thin-film transistor T1 is applied to the gate of the driving thin-film transistor T1.

The driving voltage ELVDD and the compensation voltage (Dm+Vth) are applied to opposite ends of the storage capacitor Cst, respectively, and a charge corresponding to a voltage difference between the opposite ends is stored in the storage capacitor Cst.

During an emission period, the operation control thin-film transistor T5 and the emission control thin-film transistor T6 are turned on according to the emission control signal En transmitted via the emission control line EL. The driving current $I_{OLED}$ corresponding to a voltage difference between the gate voltage of the driving thin-film transistor T1 and the driving voltage ELVDD is generated, and the driving current $I_{OLED}$ is supplied to the organic light-emitting diode OLED via the emission control thin-film transistor T6.

In the present embodiment, at least one of the plurality of thin-film transistors T1 to T7 includes a semiconductor layer including an oxide, and the other transistors may include a semiconductor layer including silicon.

For example, the driving thin-film transistor T1, which directly affects a brightness of the display apparatus, is configured to include a semiconductor layer including a polycrystalline silicon having high reliability, thereby implementing a high-resolution display apparatus.

Meanwhile, because an oxide semiconductor has high carrier mobility and low leakage current, a voltage drop is not large even with a long driving time. In other words, a color change of an image caused by the voltage drop is not large even during a low-frequency driving, and thus, a display apparatus may be driven at low frequencies.

As described above, because the oxide semiconductor has an advantage of low leakage current, at least one of the compensation thin-film transistor T3, the gate initialization thin-film transistor T4, and the anode initialization thin-film transistor T7 that are connected to the gate of the driving thin-film transistor T1 may be employed as the oxide semiconductor, and thus, a leakage current may be prevented from flowing to the gate of the driving thin-film transistor T1 and power consumption may be reduced.

Figure 5:
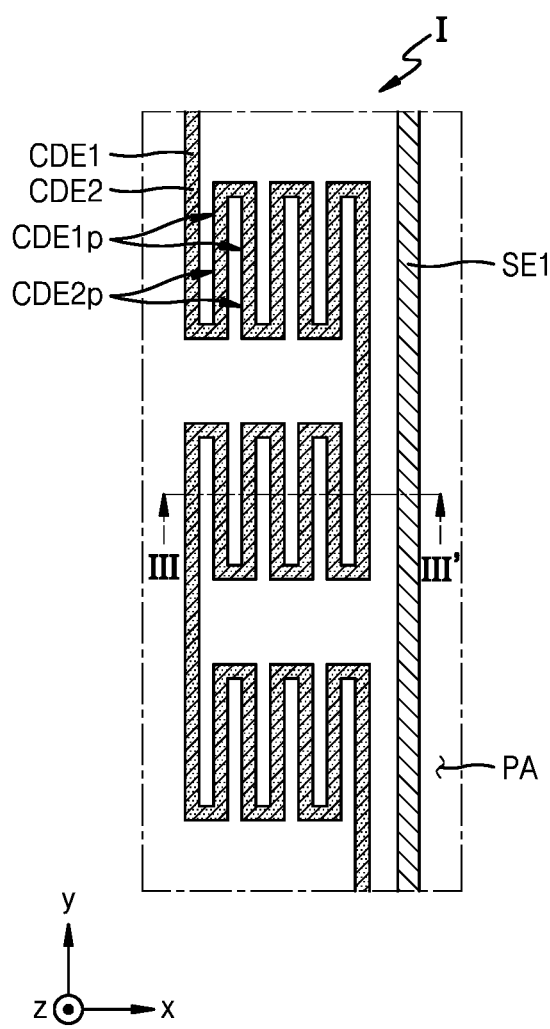
FIG. 5 is an enlarged plan view schematically illustrating a portion I of FIG. 1.

FIG. 5 is an enlarged plan view schematically illustrating a portion I of FIG. 1.

Referring to FIG. 5, each of the first crack detection electrode CDE1 and the second crack detection electrode CDE2 may include a plurality of zigzag patterns that are connected in series to each other. For example, the first crack detection electrode CDE1 may have a plurality of first portions CDE1$p$ that are apart from each other in a first direction (for example, a ±x direction), and the second crack detection electrode CDE2 may have a plurality of second portions CDE2$p$ that are apart from each other in the first direction (for example, the ±x direction). According to shapes of the zigzag patterns of each of the first crack detection electrode CDE1 and the second crack detection electrode CDE2, a resistance value of the first crack detection electrode CDE1 and a resistance value of the second crack detection electrode CDE2 may be set (or designed) to desired values, respectively.

In FIG. 5, both the first crack detection electrode CDE1 and the second crack detection electrode CDE2 include zigzag patterns that are connected in series to each other, but in another embodiment, the first crack detection electrode CDE1 or the second crack detection electrode CDE2 may not include the zigzag patterns and may be provided in a shape of the first auxiliary electrode SE1.

In another embodiment, a number of first portions CDE1$p$ of the first crack detection electrode CDE1 included in a single zigzag pattern and a number of second portions CDE2$p$ of the second crack detection electrode CDE2 included in a single zigzag pattern may be different from each other. For example, the number of first portions CDE1$p$ of the first crack detection electrode CDE1 included in a single zigzag pattern may be less than the number of second portions CDE2$p$ of the second crack detection electrode CDE2 included in a single zigzag pattern. In other words, a number of curved portions of the first crack detection electrode CDE1 included in a single zigzag pattern may be less than a number of curved portions of the second crack detection electrode CDE2 included in one zigzag pattern. For example, in FIG. 5, each of the number of curved portions of the first crack detection electrode CDE1 included in a single zigzag pattern and the number of curved portions of the second crack detection electrode CDE2 is 6, but the number of curved portions of the first crack detection electrode CDE1 included in a single zigzag pattern may be 5 or less, and the number of curved portions of the second crack detection electrode CDE2 included in a single zigzag pattern may be 6 or more. Of the 6 zigzag patterns, sets of three curved portions may be lined up in the x-direction, and be opposite another three curved portions in the y-direction.

In an embodiment, the first crack detection electrode CDE1 and the second crack detection electrode CDE2 may overlap each other. In FIG. 5, the first crack detection electrode CDE1 and the second crack detection electrode CDE2 may completely overlap each other, but embodiments are not limited thereto. The first crack detection electrode CDE1 and the second crack detection electrode CDE2 may partially overlap each other. In other words, the first crack detection electrode CDE1 and the second crack detection electrode CDE2 may at least partially overlap each other.

For example, as described above, the number of first portions CDE1$p$ of the first crack detection electrode CDE1 included in a single zigzag pattern and the number of second portions CDE2$p$ of the second crack detection electrode CDE2 included in a single zigzag pattern may be different from each other. In this case, the first portion CDE1$p$ of the first crack detection electrode CDE1 and the second portion CDE2$p$ of the second crack detection electrode CDE2 that are arranged at the outermost portion of the peripheral area PA may overlap each other, and the remaining first portions CDE1$p$ and second portions CDE2$p$ may be arranged in a deviated manner.

So far, descriptions are provided based on the first crack detection electrode CDE1 and the second crack detection electrode CDE2, but the same descriptions may also be applied to the third crack detection electrode CDE3 (see FIG. 1) and the fourth crack detection electrode CDE4 (see FIG. 1).

Figure 6:
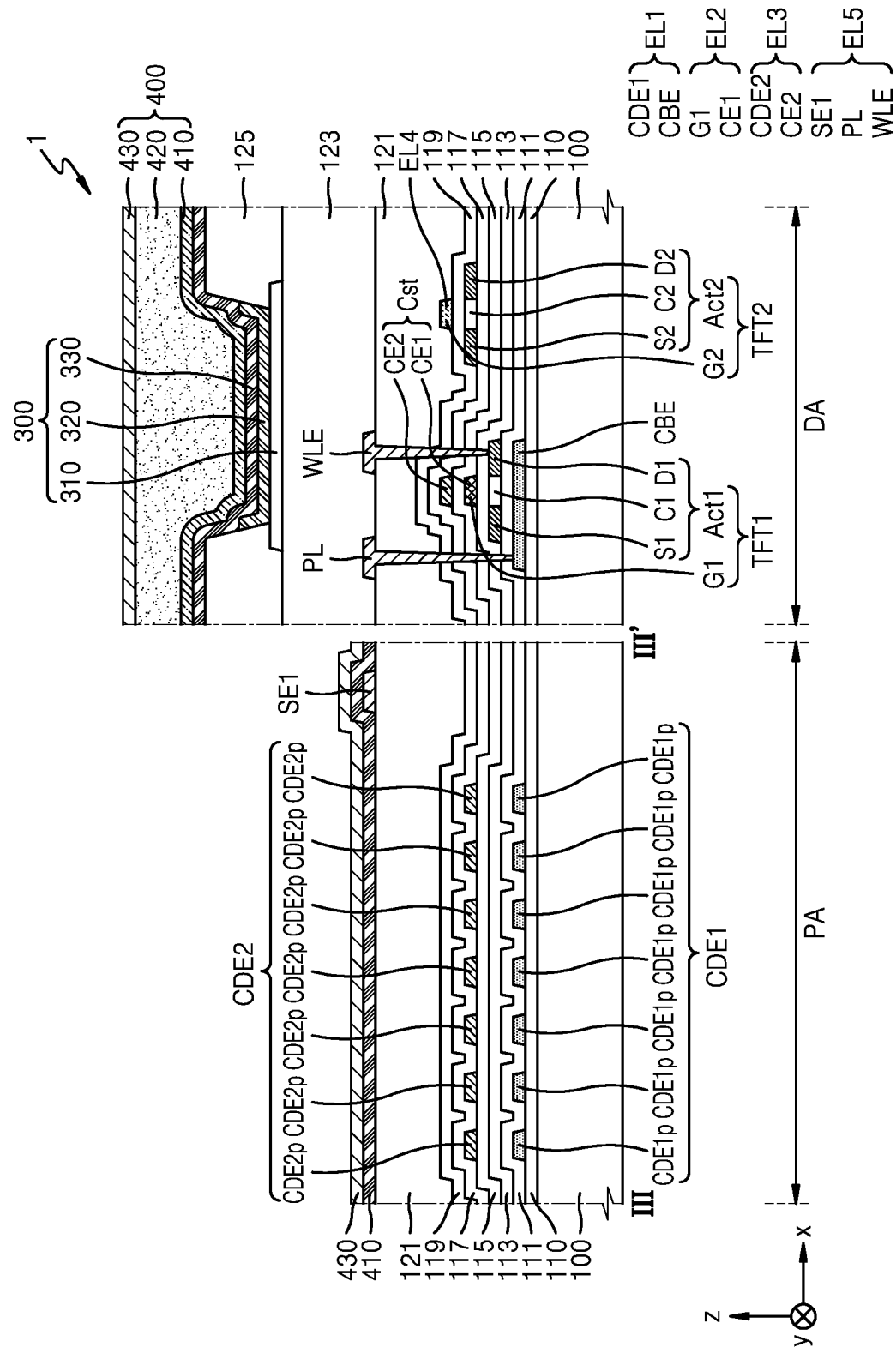
FIGS. 6 and 7 are cross-sectional views of an example of a portion of the display apparatus of FIG. 5, taken along a line III-III'.
Figure 7:
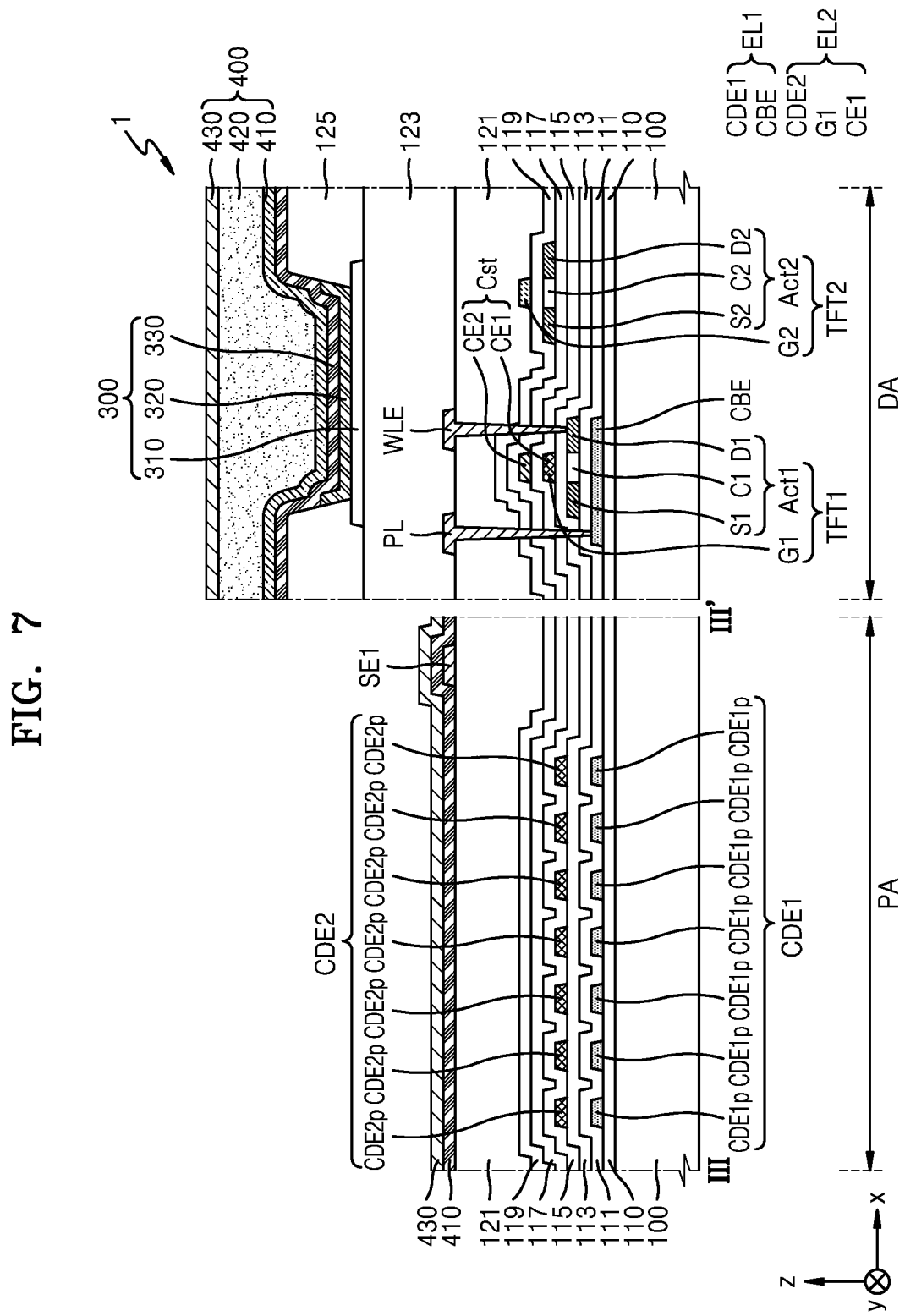

FIGS. 6 and 7 are cross-sectional views of a portion of the display apparatus of FIG. 5, taken along line III-III'.

FIGS. 6 and 7 illustrate a cross-sectional view of each of a portion of the display area DA and a portion of the peripheral area PA. Below, elements included in the display apparatus 1 will be described in greater detail according to a stacked structure thereof, and a position relationship between the first crack detection electrode CDE1, the second crack detection electrode CDE2, and the first auxiliary electrode SE1 will be described.

The substrate 100 may include a glass material, a ceramic material, a metal material, or a material that is flexible or bendable. When the substrate 100 is flexible or bendable, the substrate 100 may include a polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate.

The substrate 100 may have a single-layer or multilayer structure of the materials, and when the substrate 100 has a multilayer structure, the substrate 100 may further include an inorganic layer. In some embodiments, the substrate 100 may have a structure of an organic material, an inorganic material, and another organic material.

A barrier layer 110 may be further included between the substrate 100 and a buffer layer 111. The barrier layer 110 may prevent or minimize infiltration of impurities from the substrate 100, etc. into a first semiconductor layer Act1 and a second semiconductor layer Act2. The barrier layer 110 may include an inorganic material such as an oxide or a nitride, or an organic material, or an organic and inorganic composite, and may have a single-layer or multilayer structure of an inorganic material and an organic material.

A first conductive layer EL1 may be between the barrier layer 110 and the buffer layer 111. The first conductive layer EL1 may include a conductive material including molybdenum (Mo), aluminum (Al), copper (Cu), titanium (Ti), or the like, and may be formed in a multilayer or a single layer including the above-mentioned materials. For example, the first conductive layer EL1 may be formed of a multilayer structure of a Ti layer, an Al layer, and another Ti layer.

The first conductive layer EL1 may include the first crack detection electrode CDE1 and a channel bottom electrode (or a first electrode) CBE. The first crack detection electrode CDE1 may be arranged in the peripheral area PA, and the channel bottom electrode CBE may be arranged in the display area DA.

The first crack detection electrode CDE1 may include a plurality of first portions CDE1$p$ that are apart from each other in the first direction (for example, the ±x direction).

The channel bottom electrode CBE may overlap a channel region C1 of the first semiconductor layer (or a semiconductor pattern) Act1. The channel bottom electrode CBE may be connected to the driving voltage line PL to be described later, and configured to receive the driving voltage ELVDD. Through the channel bottom electrode CBE to which the driving voltage ELVDD is applied, when a pixel circuit including both NMOS and PMOS is driven, unnecessary charges may be prevented from being stacked on the first semiconductor layer Act1. As a result, the characteristics of a first thin-film transistor TFT1 including the first semiconductor layer Act1 may be stably maintained.

In an embodiment, when the barrier layer 110 has a multilayer structure, the first conductive layer EL1 may be between the barrier layers 110 each having the multilayer structure.

The first semiconductor layer Act1 may be disposed over the buffer layer 111. The first semiconductor layer Act1 may include amorphous silicon or polysilicon. The first semiconductor layer Act1 may include the channel region C1, a source region (or a first conductive region) S1, and a drain region (or a second conductive region) D1, wherein the source region S1 and the drain region D1 being arranged at opposite sides of the channel region C1. The first semiconductor layer Act1 may include a single layer or multiple layers.

A first gate insulating layer 113 and a second gate insulating layer 115 may be stacked on the substrate 100 to cover the first semiconductor layer Act1. The first gate insulating layer 113 and the second gate insulating layer 115 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO).

A second conductive layer EL2 may be disposed over the first gate insulating layer 113. The second conductive layer EL2 may include a conductive material including Mo, Al, Cu, Ti, or the like, and may be formed in multiple layers or a single layer including the materials. For example, the second conductive layer EL2 may have a multilayer structure of a Ti layer, an Al layer, and another Ti layer. The second conductive layer EL2 may include a first gate electrode G1 (or the lower electrode CE1) at least partially overlapping the first semiconductor layer Act1. The first gate electrode G1 may overlap the channel region C1 of the first semiconductor layer Act1.

A third conductive layer EL3 may disposed over the second gate insulating layer 115. The third conductive layer EL3 may include a conductive material including Mo, Al, Cu, Ti, or the like, and may be formed in multiple layers or a single layer including the materials. For example, the third conductive layer EL3 may have a multilayer structure of a Ti layer, an Al layer, and another Ti layer.

The third conductive layer EL3 may include the second crack detection electrode CDE2 and the upper electrode (or a second electrode) CE2. The second crack detection electrode CDE2 may be arranged in the peripheral area PA, and the upper electrode CE2 may be arranged in the display area DA.

The second crack detection electrode CDE2 may include a plurality of second portions CDE2$p$ that are apart from each other in the first direction (for example, the ±x direction). The upper electrode CE2 may at least partially overlap the first gate electrode G1.

In FIG. 6, the second crack detection electrode CDE2 is disposed over a same layer, the second gate insulating layer 115, as the upper electrode CE2. In another embodiment, as illustrated in FIG. 7, the second crack detection electrode CDE2 may be disposed over a same layer, the first gate insulating layer 113, as the lower electrode CE1. In other words, the second conductive layer EL2 may include the second crack detection electrode CDE2, the first gate electrode G1, and the lower electrode CE1.

In another embodiment, the second crack detection electrode CDE2 may be disposed over a same layer as a second gate electrode G2 to be described later. In other words, a fourth conductive layer EL4 disposed over a third gate insulating layer 119 to be described later may include the second crack detection electrode CDE2 and the second gate electrode G2.

The display apparatus 1 according to an embodiment may include the first crack detection electrode CDE1 and the second crack detection electrode CDE2 that are disposed over different layers, respectively. In this case, the first crack detection electrode CDE1 may be disposed over the barrier layer 110, and the second crack detection electrode CDE2 may be disposed over the first gate insulating layer 113, the second gate insulating layer 115, or the third gate insulating layer 119. In this case, a crack caused by an impact applied to a lower portion (for example, a substrate) and/or a lateral surface of the display apparatus 1 may occur in the first crack detection electrode CDE1, and a crack caused by an impact applied to an upper portion and/or the lateral surface of the display apparatus 1 may occur in the second crack detection electrode CDE2. Thus, a range of detection of damage to the display apparatus 1 may increase compared to a case where only one of the first crack detection electrode CDE1 and the second crack detection electrode CDE2 is provided.

In an embodiment, the storage capacitor Cst may include the lower electrode CE1 and the upper electrode CE2, and as illustrated in FIG. 6, may overlap the first thin-film transistor TFT1. For example, the first gate electrode G1 of the first thin-film transistor TFT1 may function as the lower electrode CE1 of the storage capacitor Cst. Unlike the above, the storage capacitor Cst may not overlap the first thin-film transistor TFT1 and may be separately present.

The upper electrode CE2 of the storage capacitor Cst may overlap the lower electrode CE1 with the second gate insulating layer 115 therebetween, and form a capacitance. In this case, the second gate insulating layer 115 may perform a function of a dielectric layer of the storage capacitor Cst.

In an embodiment, the first thin-film transistor TFT1 may correspond to the driving thin-film transistor T1 described above with reference to FIG. 4.

A first interlayer insulating layer 117 may be provided over the second gate insulating layer 115 to cover the upper electrode CE2 of the storage capacitor Cst. The first interlayer insulating layer 117 may include $SiO_2$, $SiN_X$, SiON, $Al_2O_3$, $TiO_2$, $Ta_2O_5$, $HfO_2$, ZnO, or the like.

The second semiconductor layer Act2 may be disposed over the first interlayer insulating layer 117. The second semiconductor layer Act2 may include an oxide semiconductor material. For example, the second semiconductor layer Act2 may include an oxide of at least one material selected from the group consisting of indium (In), gallium (Ga), stannum (Sn), zirconium (Zr), vanadium (V), hafnium (Hf), cadmium (Cd), germanium (Ge), chrome (Cr), titanium (Ti), aluminum (Al), cesium (Cs), cerium (Ce), and zinc (Zn).

For example, the second semiconductor layer Act2 may include an InSnZnO (ITZO) semiconductor layer, an InGaZnO (IGZO) semiconductor layer, or the like. Because an oxide semiconductor has a wide band gap (of about 3.1 eV), high carrier mobility, and low leakage current, a voltage drop is not large even with a long driving time, and thus, a luminance change due to the voltage drop is not large even when the display apparatus 1 is driven at low frequencies.

The second semiconductor layer Act2 may include a channel region C2, a source region (or a first conductive region) S2, and a drain region (or a second conductive region) D2, wherein the source region S2 and the drain region D2 are arranged at opposite sides of the channel region C2.

A bottom metal layer (not illustrated) may be disposed below the second semiconductor layer Act2. For example, the bottom metal layer may be included in the third conductive layer EL3 and disposed over a same layer as the upper electrode CE2. In an embodiment, the bottom metal layer may be disposed to overlap the second semiconductor layer Act2, which includes an oxide semiconductor material. Because the second semiconductor layer Act2 including the oxide semiconductor material is vulnerable to light, the bottom metal layer may prevent element characteristics of a second thin-film transistor TFT2 that includes an oxide semiconductor material from being changed by a photocurrent generated in the second semiconductor layer Act2 by external light incident from the substrate 100 side.

The third gate insulating layer 119 may be disposed over the second semiconductor layer Act2. The third gate insulating layer 119 may include $SiO_2$, $SiN_X$, SiON, $Al_2O_3$, $TiO_2$, $Ta_2O_5$, $HfO_2$, ZnO, or the like.

In FIG. 6, the third gate insulating layer 119 is disposed over the entire surface of the substrate 100 to cover the second semiconductor layer Act2, but in another embodiment, the third gate insulating layer 119 may be patterned to overlap a portion of the second semiconductor layer Act2. For example, the third gate insulating layer 119 may be patterned to overlap the channel region C2 of the second semiconductor layer Act2.

The fourth conductive layer EL4 may be disposed over the third gate insulating layer 119. The fourth conductive layer EL4 may include a conductive material including Mo, Al, Cu, Ti, or the like, and may be formed in multiple layers or a single layer including the materials. For example, the fourth conductive layer EL4 may have a multilayer structure of a Ti layer, an Al layer, and another Ti layer. The fourth conductive layer EL4 may include the second gate electrode (or a fourth electrode) G2 at least partially overlapping the second semiconductor layer Act2. The second gate electrode G2 may overlap the channel region C2 of the second gate electrode G2.

In an embodiment, the second thin-film transistor TFT2 may be any one of the plurality of thin-film transistors T1 to T7 described with reference to FIG. 4. For example, the second thin-film transistor TFT2 may be the compensation thin-film transistor T3 or the gate initialization thin-film transistor T4.

A second interlayer insulating layer 121 may be provided over the third gate insulating layer 119 to cover the fourth conductive layer EL4. The second interlayer insulating layer 121 may include $SiO_2$, $SiN_X$, SiON, $Al_2O_3$, $TiO_2$, $Ta_2O_5$, $HfO_2$, ZnO, or the like.

A fifth conductive layer EL5 may be disposed over the second interlayer insulating layer 121. The fifth conductive layer EL5 may include a conductive material including Mo, Al, Cu, Ti, or the like, and may be formed in multiple layers or a single layer including the materials. For example, the fifth conductive layer EL5 may have a multilayer structure of a Ti layer, an Al layer, and another Ti layer.

Figure 8:
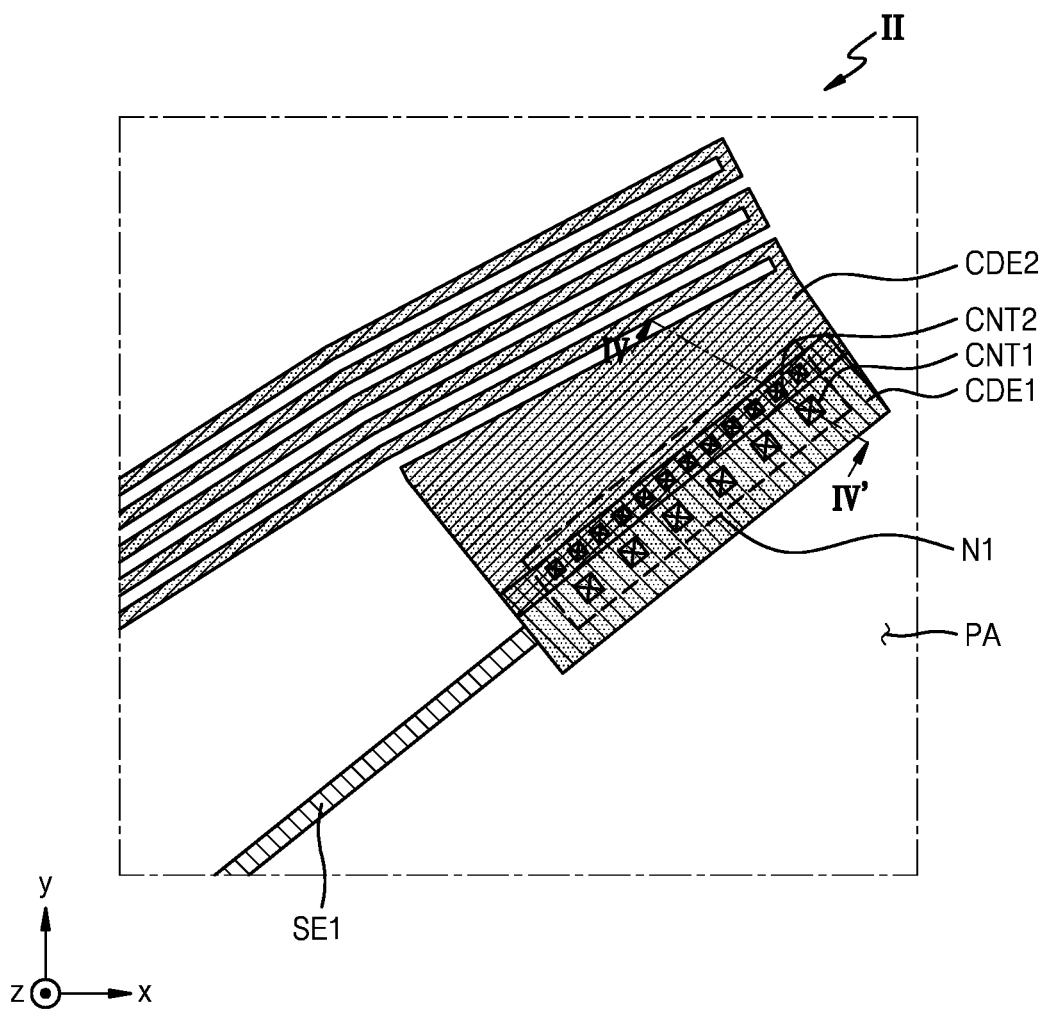
FIG. 8 is an enlarged plan view schematically illustrating a portion II of FIG. 1.
Figure 9:
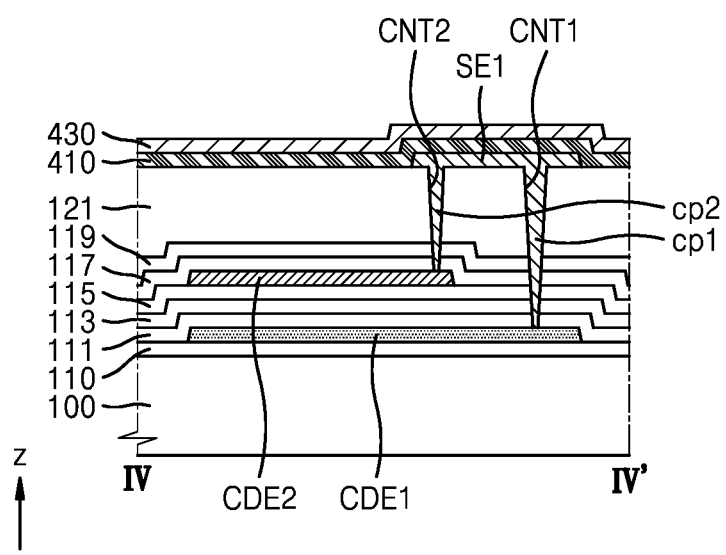
FIG. 9 is a cross-sectional view of an example of a portion of the display apparatus of FIG. 8, taken along a line IV-IV'.

The fifth conductive layer EL5 may include the first auxiliary electrode SE1, the driving voltage line PL, and a wire line electrode (or a third electrode) WLE. As illustrated in FIGS. 8 and 9 to be described later, the first auxiliary electrode SE1 may be connected to the first crack detection electrode CDE1 and the second crack detection electrode CDE2. The driving voltage line PL may be configured to receive the driving voltage ELVDD, and connected to the channel bottom electrode CBE through contact holes formed in the insulating layers. The wire line electrode WLE may be connected to the source region S1 and the drain region D1 of the first semiconductor layer Act1. In FIG. 6, the wire line electrode WLE and the drain region D1 of the first semiconductor layer Act1 are connected to each other.

The fifth conductive layer EL5 may be covered with an inorganic protective layer (not illustrated). The inorganic protective layer may be a single layer or multilayer of SiN$_X$ and silicon oxide (SiO$_X$). The inorganic protective layer may be introduced to cover and protect some lines arranged over the second interlayer insulating layer 121.

A planarization layer 123 may be disposed over the second interlayer insulating layer 121, and a display element 300 may be disposed over the planarization layer 123.

The planarization layer 123 may be formed in a single layer or multilayer of inorganic materials, and provides a flat upper surface. The planarization layer 123 may include a general-purpose polymer (for example, benzocyclobutene (BCB), polyimide, hexamethyldisiloxane (HMDSO), polymethylmethacrylate (PMMA), or polystyrene (PS)), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, and any blends thereof.

Although not illustrated in FIG. 6, the planarization layer 123 may be provided in a plurality of layers and may include a first planarization layer and a second planarization layer. In this case, a sixth conductive layer may be between the first planarization layer and the second planarization layer, and the sixth conductive layer may include the driving voltage line PL, a data line, a connection line, or the like.

In an embodiment, as illustrated in FIG. 6, a portion of the planarization layer 123 may be omitted in the peripheral area PA.

The display element 300 may be disposed over the planarization layer 123. The display element 300 may include a pixel electrode 310, an intermediate layer 320 including an organic emission layer, and an opposite electrode 330.

The pixel electrode 310 may be a (semi)light-transmitting electrode or a reflective electrode. In some embodiments, the pixel electrode 310 may include a reflective film that includes silver (Ag), magnesium (Mg), aluminum (Al), platinum (Pt), palladium (Pd), gold (Au), nickel (Ni), neodymium (Nd), iridium (Ir), chromium (Cr), and any compounds thereof, and a transparent or translucent electrode layer formed over the reflective film. The transparent or translucent electrode layer may include at least one selected from the group consisting of indium tin oxide (ITO), indium zinc oxide (IZO), zinc oxide (ZnO), indium oxide (In$_2$O$_3$), indium gallium oxide (IGO), or aluminum zinc oxide (AZO). In some embodiments, the pixel electrode 310 may be provided in ITO, Ag, and another ITO.

A pixel-defining layer 125 may be disposed over the planarization layer 123. In addition, the pixel-defining layer 125 may increase a distance between an edge of the pixel-defining layer 125 and the opposite electrode 330 over the pixel electrode 310, thereby preventing an arc or the like from occurring at an edge of the pixel electrode 310.

The pixel-defining layer 125 is one or more organic insulating materials selected from the group consisting of polyimide, polyamide, acryl-based resin, BCB, and phenol resin, and may be formed by using a spin coating method or the like.

The intermediate layer 320 may be arranged in an opening formed by the pixel-defining layer 125. The intermediate layer 320 may include an organic emission layer. The organic emission layer may include an organic material that includes a fluorescent or phosphorescent material emitting red, green, blue, or white light. The organic emission layer may be a low-molecular weight organic material or a polymer organic material, and below and over the organic emission layer, a functional layer such as a hole transport layer (HTL), a hole injection layer (HIL), an electron transport layer (ETL), an electron injection layer (EIL), or the like may be further selectively disposed.

The intermediate layer 320 may be disposed to correspond to each of a plurality of pixel electrodes 310. However, the inventive concepts is not limited thereto. For example, the intermediate layer 320 may include a layer that is integral over the plurality of pixel electrodes 310, and various modifications may be made.

The opposite electrode 330 may be a light-transmitting electrode or a reflective electrode. In some embodiments, the opposite electrode 330 may be a transparent or translucent electrode, and may include a metal thin film having a low work function such as lithium (Li), calcium (Ca), lithium fluoride/calcium (LiF/Ca), LiF/Al, Al, Ag, Mg, and any compounds thereof. In addition, a transparent conductive oxide layer, such as an ITO layer, an IZO layer, a ZnO layer, or an In$_2$O$_3$ layer, may be further disposed over the metal thin film. The opposite electrode 330 may be arranged over the display area DA, and may be disposed on an upper portion of the intermediate layer 320 and the pixel-defining layer 125. The opposite electrode 330 may be integrally formed as a single body with a plurality of display elements 300 and may correspond to the plurality of pixel electrodes 310.

The display element 300 may be covered with an encapsulation layer 400. The encapsulation layer 400 may include at least one organic encapsulation layer and at least one inorganic encapsulation layer, and in FIG. 6, the encapsulation layer 400 includes a first inorganic encapsulation layer 410, a second inorganic encapsulation layer 430, and an organic encapsulation layer 420 therebetween. In another embodiment, a number of organic encapsulation layers, a number of inorganic encapsulation layers, and a stacked order thereof may be changed.

Each of the first inorganic encapsulation layer 410 and the second inorganic encapsulation layer 430 include one or more inorganic materials from among aluminum oxide, titanium oxide, tantalum oxide, hafnium oxide, zinc oxide, silicon oxide, silicon nitride, and silicon oxynitride. The first inorganic encapsulation layer 410 and the second inorganic encapsulation layer 430 may be a single layer or multilayer including the materials described above. The organic encapsulation layer 420 may include a polymer-based material. The polymer-based material may include acryl-based resin such as PMMA and polyacrylic acid, epoxy-based resin, polyimide, polyethylene, etc. In an embodiment, the organic encapsulation layer 420 may include acrylate polymer.

A material of the first inorganic encapsulation layer 410 and a material of the second inorganic encapsulation layer 430 may be different from each other. For example, the first inorganic encapsulation layer 410 may include silicon oxynitride, and the second inorganic encapsulation layer 430 may include silicon oxynitride. A thickness of the first inorganic encapsulation layer 410 and a thickness of the second inorganic encapsulation layer 430 may be different from each other. The thickness of the first inorganic encapsulation layer 410 may be greater than the thickness of the second inorganic encapsulation layer 430. In some embodiments, the thickness of the second inorganic encapsulation layer 430 may be greater than the thickness of the first inorganic encapsulation layer 410, or the thickness of the second inorganic encapsulation layer 430 and the thickness of the second inorganic encapsulation layer 430 may be a same.

Meanwhile, as described above, because a portion of the planarization layer 123 may be omitted in the peripheral area PA, the first auxiliary electrode SE1 arranged in the peripheral area PA may be in direct contact with the first inorganic encapsulation layer 410.

So far, descriptions are provided based on the first crack detection electrode CDE1 and the second crack detection electrode CDE2, but the same descriptions may also be applied to the third crack detection electrode CDE3 (see FIG. 1) and the fourth crack detection electrode CDE4 (see FIG. 1).

FIG. 8 is an enlarged plan view schematically illustrating a portion II of FIG. 1, and FIG. 9 is a cross-sectional view of an example of a portion of the display apparatus in FIG. 8, taken along line IV-IV'.

As illustrated in FIG. 1, the second end portion e21 of the first crack detection electrode CDE1, the second end portion e22 of the second crack detection electrode CDE2, and the first end portion es11 of the first auxiliary electrode SE1 may be connected to one another at the first node N1. The first node N1 may be located on the other side (for example, an upper end portion of a display panel) of the peripheral area PA.

Referring to FIGS. 8 and 9, the first crack detection electrode CDE1 and the second crack detection electrode CDE2 may be connected to each other through the first auxiliary electrode SE1.

The first crack detection electrode CDE1 may be connected to the first auxiliary electrode SE1 through a first contact hole CNT1 that is formed in the buffer layer 111, the first gate insulating layer 113, the second gate insulating layer 115, the first interlayer insulating layer 117, the third gate insulating layer 119, and the second interlayer insulating layer 121. In detail, a first contact plug cp1, which is a portion of the first auxiliary electrode SE1, may be embedded in the first contact hole CNT1 and directly contact the first crack detection electrode CDE1, and the first crack detection electrode CDE1 and the first auxiliary electrode SE1 may be connected to each other.

The second crack detection electrode CDE2 may be connected to the first auxiliary electrode SE1 through a second contact hole CNT2 that is formed in the first interlayer insulating layer 117, the third gate insulating layer 119, and the second interlayer insulating layer 121. In detail, a second contact plug cp2, which is a portion of the first auxiliary electrode SE1, may be embedded in the second contact hole CNT2 and may directly contact the second crack detection electrode CDE2, and the second crack detection electrode CDE2 and the first auxiliary electrode SE1 may be connected to each other.

In FIG. 8, the first crack detection electrode CDE1 and the first auxiliary electrode SE1 are connected to each other through a plurality of first contact holes CNT1, and the second crack detection electrode CDE2 and the first auxiliary electrode SE1 are connected to each other through a plurality of second contact holes CNT2, but a number of first contact holes CNT1 and a number of second contact holes CNT2 may be variously modified. For example, each of the first contact hole CNT1 and the second contact hole CNT2 may not be provided in plural and may be provided in singular.

In FIGS. 8 and 9, descriptions are provided based on the first node N1, but the same descriptions may also applied in a same manner to a second node N2 (see FIG. 1) to which the first crack detection electrode CDE1 and the second crack detection electrode CDE2 are connected. In other words, the first crack detection electrode CDE1 and the second crack detection electrode CDE2 may be connected to each other through an electrode disposed over the second interlayer insulating layer 121. In addition, the descriptions may also be applied in the same manner to the third node N3 and the fourth node N4 illustrated in FIG. 1.

Figure 10:
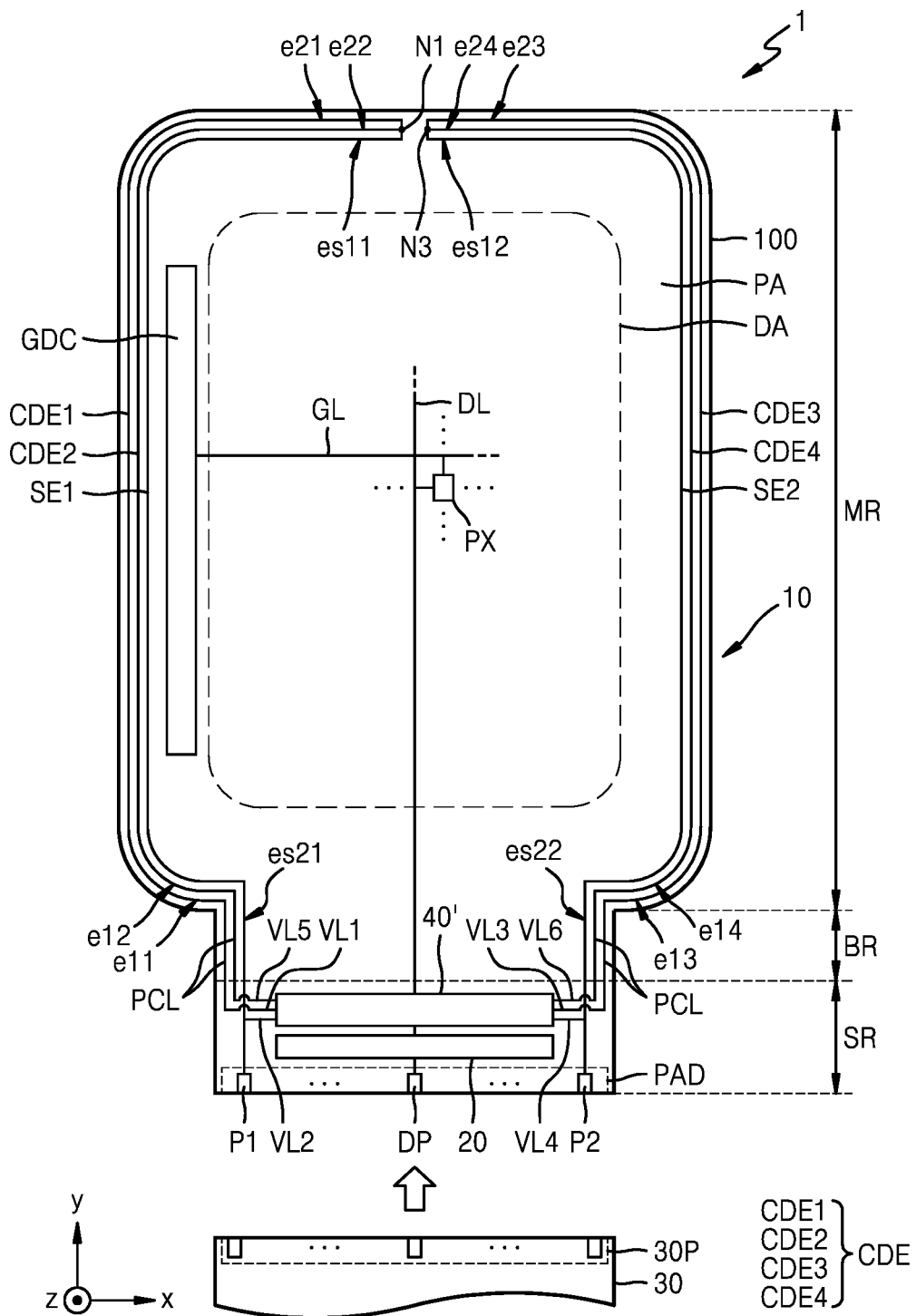
FIG. 10 is a plan view schematically illustrating a display apparatus according to another embodiment.
Figure 11:
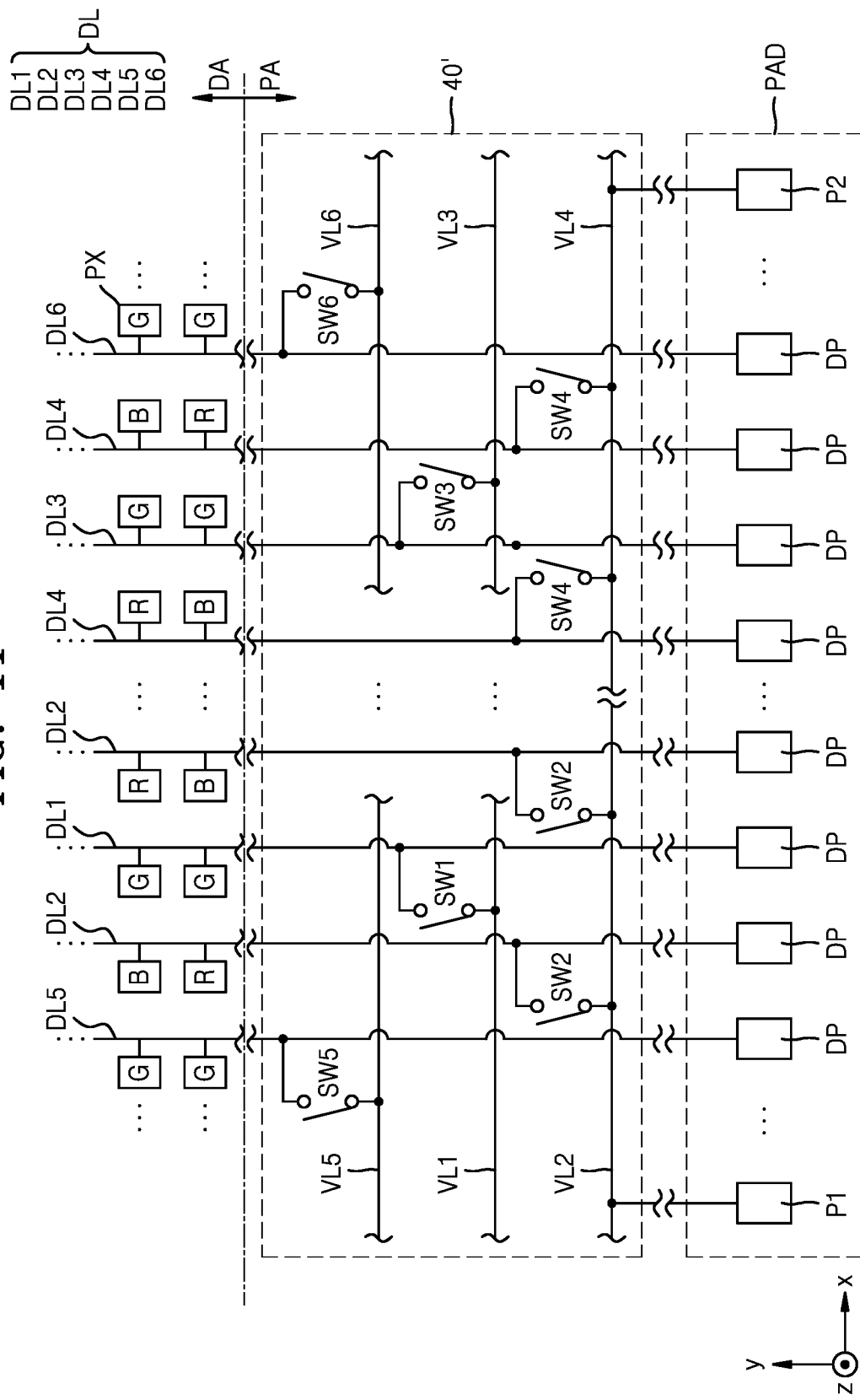
FIG. 11 is an enlarged plan view schematically illustrating a portion of the display apparatus of FIG. 10.

FIG. 10 is a plan view schematically illustrating a display apparatus according to another embodiment, and FIG. 11 is an enlarged plan view schematically illustrating a portion of the display apparatus in FIG. 10. FIGS. 10 and 11 are modified embodiments of FIGS. 1 and 3, respectively, and FIGS. 10 and 11 differ from FIGS. 1 and 3 with respect to a connection structure between a crack detection electrode and an inspection circuit. Descriptions of FIGS. 10 and 11 that overlap those of FIGS. 1 and 3 will be omitted, and only differences will be mainly described below.

In FIG. 1, the first end portion e11 of the first crack detection electrode CDE1 and the first end portion e12 of the second crack detection electrode CDE2 are electrically connected to a same voltage line, that is, the first voltage line VL1, but referring to FIG. 10, the first end portion e11 of the first crack detection electrode CDE1 and the first end portion e12 of the second crack detection electrode CDE2 may be electrically connected to different voltage lines, respectively.

For example, as illustrated in FIGS. 10 and 11, a detection circuit 40' may further include a fifth voltage line VL5. The first end portion e11 of the first crack detection electrode CDE1 may be electrically connected to the first voltage line VL1, and the first end portion e12 of the second crack detection electrode CDE2 may be electrically connected to the fifth voltage line VL5.

Although descriptions are provided based on the first crack detection electrode CDE1 and the second crack detection electrode CDE2, the same descriptions may also be applied to the third crack detection electrode CDE3 and the first crack detection electrode CDE1. In other words, the detection circuit 40' may further include a sixth voltage line VL6. The first end portion e13 of the third crack detection electrode CDE3 may be electrically connected to the third voltage line VL3, and the first end portion e14 of the fourth crack detection electrode CDE4 may be electrically connected to the sixth voltage line VL6.

Meanwhile, as illustrated in FIG. 11, the detection circuit 40' may further include a fifth switch SW5 and a sixth switch SW6, in addition to the fifth voltage line VL5 and the sixth voltage line VL6.

Among the data lines DL, a data line connected to the fifth voltage line VL5 of the detection circuit 40' may be referred to as a fifth data line DL5, and a data line connected to the sixth voltage line VL6 of the detection circuit 40' may be referred to as a sixth data line DL6.

The fifth switch SW5 may include a first terminal connected to the fifth voltage line VL5, and a second terminal connected to the fifth data line DL5. The fifth switch SW5 may be turned on according to a control signal and may connect the fifth voltage line VL5 and the fifth data line DL5 to each other.

The sixth switch SW6 may include a first terminal connected to the sixth voltage line VL6, and a second terminal connected to the sixth data line DL6. The sixth switch SW6 may be turned on according to a control signal and may connect the sixth voltage line VL6 and the sixth data line DL6 to each other.

In an embodiment, the first to sixth switches SW1, SW2, SW3, SW4, SW5, and SW6 may be simultaneously controlled. In other words, the first to sixth switches SW1, SW2, SW3, SW4, SW5, and SW6 may be simultaneously turned on or off according to a same control signal. For example, the printed circuit board 30 (see FIG. 1) is attached to the pad portion PAD and a data signal is transmitted to the data pad DP, the first to sixth switches SW1, SW2, SW3, SW4, SW5, and SW6 may be simultaneously turned off according to the same control signal.

Meanwhile, as described above with reference to FIG. 1, the first crack detection electrode CDE1 and the second crack detection electrode CDE2 may be arranged at an outer periphery of the peripheral area PA, and may be disconnected by an impact applied to the display panel 10 and/or the display apparatus 1. When the first crack detection electrode CDE1 and/or the second crack detection electrode CDE2 are/is connected, an electrical signal transmitted via the first voltage line VL1 by passing through the first voltage line VL1 and/or an electrical signal transmitted via the fifth voltage line VL5 by passing through the second crack detection electrode CDE2 may be different from an electrical signal transmitted via the second voltage line VL2.

For example, an electrical signal transmitted from the first pad P1 may include a black data voltage. When a crack does not occur, the electrical signal transmitted via the first voltage line VL1 by passing through the first crack detection electrode CDE1, the electrical signal transmitted via the fifth voltage line VL5 by passing through the second crack detection electrode CDE2, and the electrical signal transmitted via the second voltage line VL2 may be a same voltage, that is, the black data voltage. Accordingly, the first data line DL1 connected to the first voltage line VL1 receives the black data voltage via the first switch SW1, and pixels PX connected to the first data line DL1 receive the black data voltage, and thus, light is not emitted. The second data line DL2 connected to the second voltage line VL2 via the second switch SW2 receives the black data voltage, and pixels PX connected to the second data line DL2 receive the black data voltage, and thus, light is not emitted. In addition, the fifth data line DL5 connected to the fifth voltage line VL5 via the fifth switch SW5 receives the black data voltage, and pixels PX connected to the fifth data line DL5 receives the black data voltage, and thus, light is not emitted.

On the other hand, when a crack occurs and the first crack detection electrode CDE1 is disconnected, the electrical signal transmitted via the first voltage line VL1 may be higher or lower than the black data voltage. Thus, the first data line DL1 connected to the first voltage line VL1 via the first switch SW1 receives a voltage different from the black data voltage, and the pixels PX connected to the first data line DL1 emit light. The second data line DL2 and the fifth data line DL5 still receive the black data voltage, and thus, pixels PX respectively connected to the second data line DL2 and the fifth data line DL5 do not emit light.

A case where a crack occurs and the first crack detection electrode CDE1 is disconnected is described as an example, but due to the crack, the second crack detection electrode CDE2 may be disconnected or both the first crack detection electrode CDE1 and the second crack detection electrode CDE2 may be disconnected. When a crack occurs and the second crack detection electrode CDE2 is disconnected, the electrical signal transmitted via the fifth voltage line VL5 may be higher or lower than the black data voltage. Accordingly, the fifth data line DL5 connected to the fifth voltage line VL5 via the fifth switch SW5 receives a voltage different from the black data voltage, and the pixels PX connected to the fifth data line DL5 emit light. When both the first crack detection electrode CDE1 and the second crack detection electrode CDE2 are disconnected, the pixels PX respectively connected to the first data line DL1 and the fifth data line DL5 emit light.

As described above, whether a crack occurs may be identified according to whether the pixels PX respectively connected to the first data line DL1 and the fifth data line DL5 emit light.

In addition, the first crack detection electrode CDE1 and the second crack detection electrode CDE2 may be disposed over different layers from each other as described above with reference to FIGS. 6 and 7, and thus, a position at which the crack occurs may be estimated according to whether the pixels PX respectively connected to the first data line DL1 and the fifth data line DL5 emit light. For example, when the pixels PX connected to the first data line DL1 emit light, this signifies that the first crack detection electrode CDE1 is disconnected, and thus, the inspection circuit 40' may estimate that the crack occurs due to an external force applied from a lower portion of the display panel 10.

Figure 12:
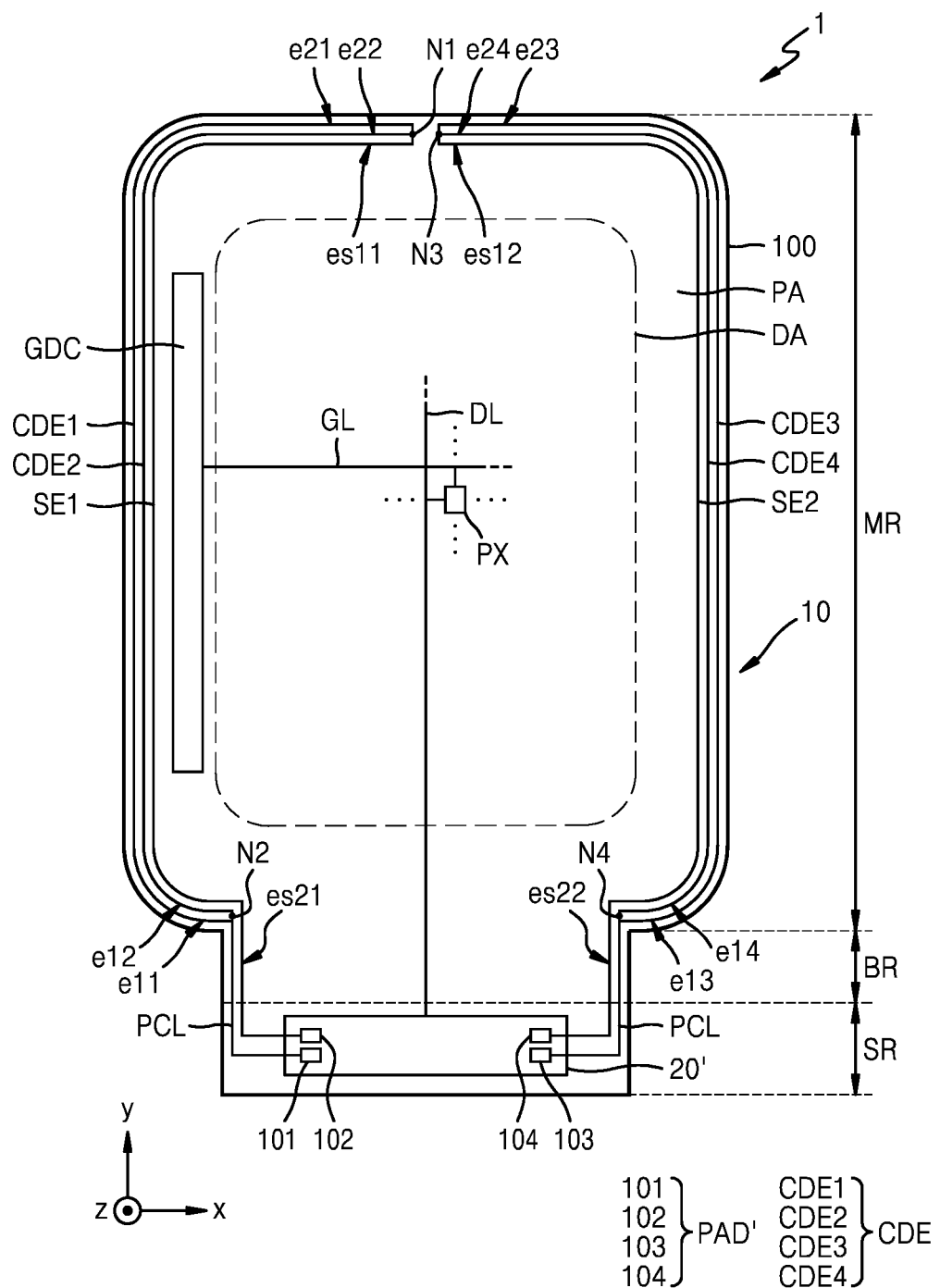
FIG. 12 is a plan view schematically illustrating a display apparatus according to another embodiment.

FIG. 12 is a plan view schematically illustrating a display apparatus according to another embodiment. FIG. 12 is a modified embodiment of FIG. 1, and FIG. 12 differs from FIG. 1 with respect to a connection structure between a crack detection electrode and a pad portion. Descriptions of FIG. 12 that overlap with those of FIG. 1 will be omitted, and differences will be mainly described below.

In FIG. 1, the inspection circuit 40 may determine whether a crack occurs, whereas, referring to FIG. 12, the inspection circuit 40 may be omitted, and the crack detection electrodes CDE may be electrically connected to pad portions PAD', respectively. In this case, the pad portion PAD' may overlap a driving chip 20' and may be connected to the driving chip 20'.

For example, as illustrated in FIG. 12, the first end portion e11 of the first crack detection electrode CDE1 and the first end portion e12 of the second crack detection electrode CDE2 may be electrically connected to a first pad 101 of the pad portion PAD'. The second end portion es21 of the first auxiliary electrode SE1 may be electrically connected to a second pad 102 of the pad portion PAD'. The first end portion e13 of the third crack detection electrode CDE3 and the first end portion e14 of the fourth crack detection electrode CDE4 may be electrically connected to a third pad 103 of the pad portion PAD'. The second end portion es22 of the second auxiliary electrode SE2 may be electrically connected to a fourth pad 104 of the pad portion PAD'.

In FIG. 12, the first end portion e11 of the first crack detection electrode CDE1 and the first end portion e12 of the second crack detection electrode CDE2 may be electrically connected to a same pad, that is, the first pad 101, but in another embodiment, the first end portion e11 of the first crack detection electrode CDE1 and the first end portion e12 of the second crack detection electrode CDE2 may be electrically connected to different pads, respectively. This will be described later with reference to FIG. 14.

Through the first crack detection electrode CDE1, the second crack detection electrode CDE2, and the first auxiliary electrode SE1 arranged as described above, it may be estimated according to embodiments described herein whether a defect occurs at one side (for example, the left side) of the display panel 10 and/or the display apparatus 1. For example, an electrical signal input to the first pad 101 may first reach the first end portion e11 of the first crack detection electrode CDE1 and the first end portion e12 of the second crack detection electrode CDE2. Then, the electrical signal may reach the second end portion es21 of the first auxiliary electrode SE1 and the second pad 102 through the second end portion e21 of the first crack detection electrode CDE1, the second end portion e22 of the second crack detection electrode CDE2, and the first end portion es11 of the first auxiliary electrode SE1. Through the electrical signal, an output resistance value of at least one of the first crack detection electrode CDE1, the second crack detection electrode CDE2, and the first auxiliary electrode SE1 may be measured. In this case, the electrical signal may be a current and/or a voltage. Based on a difference between the measured output resistance value and a preset resistance value, the system described herein may estimate whether a defect occurs in the display panel 10 and/or the display apparatus 1.

Meanwhile, in an embodiment, the first crack detection electrode CDE1 and the second crack detection electrode CDE2 may be farther apart from the display area DA than the first auxiliary electrode SE1. The first auxiliary electrode SE1 may be arranged between the first crack detection electrode CDE1 and the display area DA and between the second crack detection electrode CDE2 and the display area DA. In this case, the first crack detection electrode CDE1 and the second crack detection electrode CDE2 may be arranged at an outer periphery of the peripheral area PA and disconnected by an impact applied to the display panel 10 and/or the display apparatus 1, and the first auxiliary electrode SE1 may transfer, to the pad portion PAD, an electrical signal that passes through the disconnected first crack detection electrode CDE1 and the disconnected second crack detection electrode CDE2. When the first crack detection electrode CDE1 and the second crack detection electrode CDE2 are arranged at the outer periphery of the peripheral area PA, a range in which a crack generated in the display panel 10 and/or the display apparatus 1 is detected further increases compared to a case where only one of the first crack detection electrode CDE1 or the second crack detection electrode CDE2 is arranged. Thus, the crack generated in the display panel 10 and/or the display apparatus 1 may be accurately detected in a wider range.

Descriptions are provided based on the first crack detection electrode CDE1, the second crack detection electrode CDE2, and the first auxiliary electrode SE1, which are arranged at one side (for example, the left side) of the display panel 10, but the same descriptions may also be applied to the third crack detection electrode CDE3, the fourth crack detection electrode CDE4, and the second auxiliary electrode SE2, which are arranged at the other side (for example, the right side) of the display panel 10.

Figure 13:
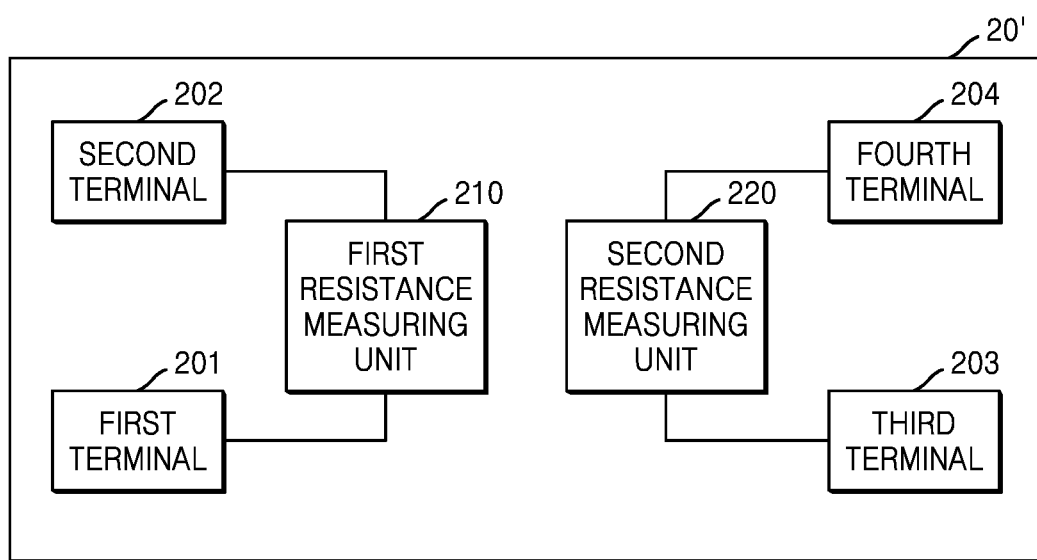
FIG. 13 is a block diagram schematically illustrating a driving chip of FIG. 12.

FIG. 13 is a block diagram schematically illustrating the driving chip 20' of FIG. 12.

Referring to FIG. 13, the driving chip 20' may include a first terminal 201, a second terminal 202, a third terminal 203, a fourth terminal 204, a first resistance measuring unit 210, and a second resistance measuring unit 220.

As described above with reference to FIG. 12, the pad portion PAD' and the driving chip 20' that are arranged in the sub-region SR may be connected to each other. Pads of the pad portion PAD' may be connected to (or contact) the terminals of the driving chip 20'. For example, the first pad 101 of the pad portion PAD' may be connected to the first terminal 201 of the driving chip 20', the second pad 102 of the pad portion PAD' may be connected to the second terminal 202 of the driving chip 20', the third pad 103 of the pad portion PAD' may be connected to the third terminal 203 of the driving chip 20', and the fourth pad 104 of the pad portion PAD' may be connected to the fourth terminal 204 of the driving chip 20'.

The first resistance measuring unit 210 may be electrically connected to the first terminal 201 and the second terminal 202. Because the first terminal 201 and the second terminal 202 are connected to the first pad 101 and the second pad 102, respectively, the first resistance measuring unit 210 may be electrically connected to the first pad 101 and the second pad 102. As described above with reference to FIG. 12, the first pad 101 may be electrically connected to the first crack detection electrode CDE1 and the second crack detection electrode CDE2, and the second pad 102 may be electrically connected to the first auxiliary electrode SE1. Thus, an output resistance value of at least one of the first crack detection electrode CDE1, the second crack detection electrode CDE2, and the first auxiliary electrode SE1 may be measured by the first resistance measuring unit 210.

The output resistance value of at least one of the first crack detection electrode CDE1, the second crack detection electrode CDE2, and the first auxiliary electrode SE1 may include (or denote) an output resistance value of each of the first crack detection electrode CDE1, the second crack detection electrode CDE2, and the first auxiliary electrode SE1, an output resistance value of the first crack detection electrode CDE1 and the first auxiliary electrode SE1 connected to each other in series, an output resistance value of the second crack detection electrode CDE2 and the first auxiliary electrode SE1 connected to each other in series, an output resistance value of the first crack detection electrode CDE1 and the second crack detection electrode CDE2 connected to each other in parallel, or an output resistance value of the first crack detection electrode CDE1, the second crack detection electrode CDE2, and the first auxiliary electrode SE1 connected to each other in series or in parallel.

The second resistance measuring unit 220 may be electrically connected to the third terminal 203 and the fourth terminal 204. The third terminal 203 and the fourth terminal 204 are connected to the third pad 103 and the fourth pad 104, respectively, and thus, the second resistance measuring unit 220 may be electrically connected to the third pad 103 and the fourth pad 104. As described with reference to FIG. 12, the third pad 103 may be electrically connected to the third crack detection electrode CDE3 and the fourth crack detection electrode CDE4, and the fourth pad 104 may be electrically connected to the second auxiliary electrode SE2. Thus, an output resistance value of at least one of the third crack detection electrode CDE3, the fourth crack detection electrode CDE4, and the second auxiliary electrode SE2 may be measured by the second resistance measuring unit 220.

When an impact is applied to the display panel 10 (see FIG. 1) and/or the display apparatus 1 (see FIG. 1), the impact may be transferred, and at least one of the crack detection electrodes CDE (see FIG. 1) may be disconnected. In this case, the measured output resistance values of the crack detection electrodes CDE may be greater than a preset resistance value, and through the change in output resistance values of the crack detection electrodes CDE, it may be estimated whether a defect occurs in the display panel 10 and/or the display apparatus 1.

As described above with reference to FIG. 12, the first crack detection electrode CDE1, the second crack detection electrode CDE2, and the first auxiliary electrode SE1 may be arranged on one side (for example, a left side) of the display panel 10, and the third crack detection electrode CDE3, fourth crack detection electrode CDE4, and the second auxiliary electrode SE2 may be arranged on the other side (For example, a right side) of the display panel 10. In this case, it may be estimated whether a defect occurs in an area of one side of the display panel 10 and/or the display apparatus 1 through the first crack detection electrode CDE1, the second crack detection electrode CDE2, and the first auxiliary electrode SE1, and it may be estimated whether a defect occurs in an area of the other side of the display panel 10 and/or the display apparatus 1 through the third crack detection electrode CDE3, the fourth crack detection electrode CDE4, and the second auxiliary electrode SE2.

FIG. 13 illustrates an example in which a resistance measuring unit is provided in the driving chip 20', and in another example, the resistance measuring unit is provided separately from the driving chip 20'.

Figure 14:
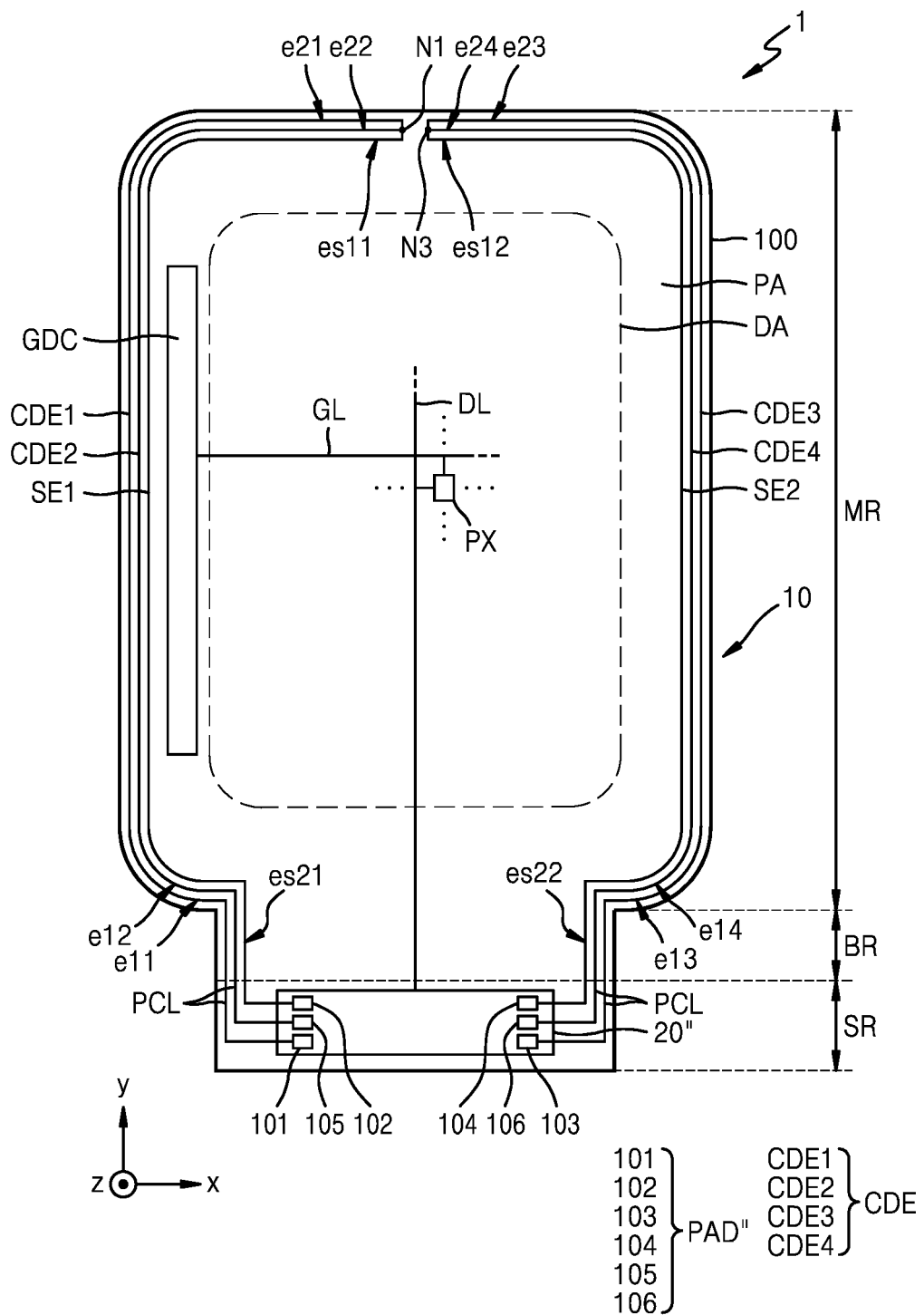
FIG. 14 is a plan view schematically illustrating a display apparatus according to another embodiment.
Figure 15:
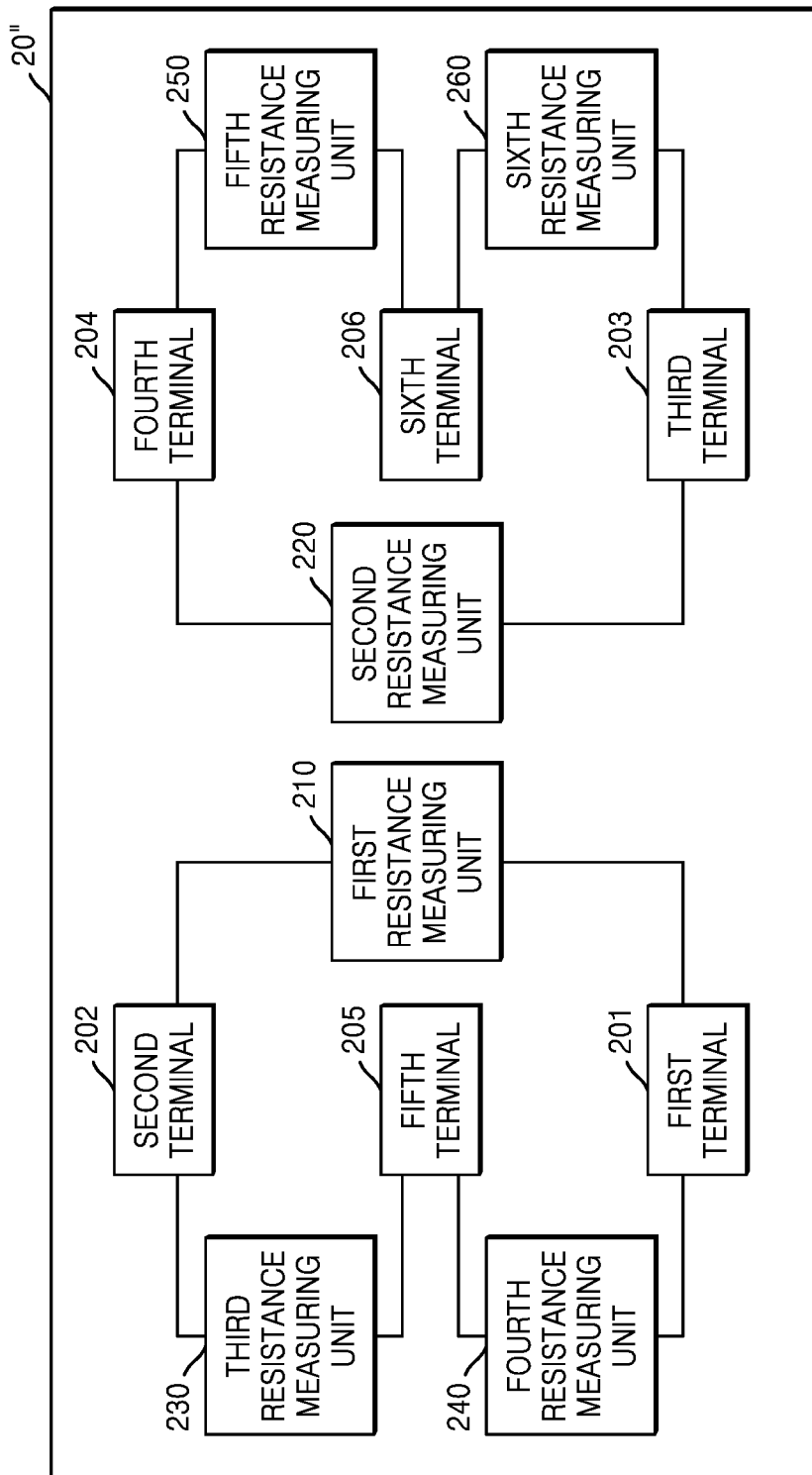
FIG. 15 is a block diagram schematically illustrating a driving chip of FIG. 14.

FIG. 14 is a plan view schematically illustrating a display apparatus according to another embodiment, and FIG. 15 is a block diagram schematically illustrating a driving chip 20" of FIG. 14. FIGS. 14 and 15 are modified examples of FIGS. 12 and 13, respectively, and FIGS. 14 and 15 differ from FIGS. 12 and 13 with respect to a connection structure between a second crack detection electrode and a pad portion. Descriptions of FIGS. 14 and 15 that overlap those of FIGS. 12 and 13 will be omitted, and only differences will be mainly described below.

In FIG. 12, the first end portion e11 of the first crack detection electrode CDE1 and the first end portion e12 of the second crack detection electrode CDE2 are electrically connected to a same pad, that is, the first pad 101, whereas, referring to FIG. 14, the first end portion e11 of the first crack detection electrode CDE1 and the first end portion e12 of the second crack detection electrode CDE2 may be electrically connected to different pads, respectively.

For example, as illustrated in FIG. 14, a pad portion PAD" may further include a fifth pad 105. The first end portion e11 of the first crack detection electrode CDE1 may be electrically connected to the first pad 101, and the first end portion e12 of the second crack detection electrode CDE2 may be electrically connected to the fifth pad 105.

Although descriptions are provided based on the first crack detection electrode CDE1 and the second crack detection electrode CDE2, the same descriptions may also be applied to the third crack detection electrode CDE3 and the fourth crack detection electrode CDE4. In other words, the pad portion PAD" may further include a sixth pad 106. The first end portion e13 of the third crack detection electrode CDE3 may be electrically connected to the third pad 103, and the first end portion e14 of the fourth crack detection electrode CDE4 may be electrically connected to the sixth pad 106.

However, as illustrated in FIG. 15, as the pad portion PAD" further includes the fifth pad 105 and the sixth pad 106, a driving chip 20" may further include a fifth terminal 205 and a sixth terminal 206. In addition, the driving chip 20" may further include a third resistance measuring unit 230, a fourth resistance measuring unit 240, a fifth resistance measuring unit 250, and a sixth resistance measuring unit 260.

The fifth pad 105 of the pad portion PAD" may be connected to the fifth terminal 205 of the driving chip 20", and the sixth pad 106 of the pad portion PAD" may be connected to the sixth terminal 206 of the driving chip 20".

The first resistance measuring unit 210 may be electrically connected to the first terminal 201 and the second terminal 202. Because the first terminal 201 and the second terminal 202 are connected to the first pad 101 and the second pad 102, respectively, the first resistance measuring unit 210 may be electrically connected to the first pad 101 and the second pad 102. The first pad 101 may be electrically connected to the first crack detection electrode CDE1, and the second pad 102 may be electrically connected to the first auxiliary electrode SE1. Thus, an output resistance value of at least one of the first crack detection electrode CDE1 and the first auxiliary electrode SE1 may be measured by the first resistance measuring unit 210.

The second resistance measuring unit 220 may be electrically connected to the third terminal 203 and the fourth terminal 204. The third terminal 203 and the fourth terminal 204 are connected to the third pad 103 and the fourth pad 104, respectively, and thus, the second resistance measuring unit 220 may be electrically connected to the third pad 103 and the fourth pad 104. The third pad 103 may be electrically connected to the third crack detection electrode CDE3, and the fourth pad 104 may be electrically connected to the second auxiliary electrode SE2. Thus, an output resistance value of at least one of the third crack detection electrode CDE3 and the second auxiliary electrode SE2 may be measured by the second resistance measuring unit 220.

The third resistance measuring unit 230 may be electrically connected to the second terminal 202 and the fifth terminal 205. The second terminal 202 and the fifth terminal 205 are connected to the second pad 102 and the fifth pad 105, respectively, and thus, the third resistance measuring unit 230 may be electrically connected to the second pad 102 and the fifth pad 105. The second pad 102 may be electrically connected to the first auxiliary electrode SE1, and the fifth pad 105 may be electrically connected to the second crack detection electrode CDE2. Thus, an output resistance value of at least one of the second crack detection electrode CDE2 and the first auxiliary electrode SE1 may be measured by the third resistance measuring unit 230.

The fourth resistance measuring unit 240 may be electrically connected to the first terminal 201 and the fifth terminal 205. The first terminal 201 and the fifth terminal 205 are connected to the first pad 101 and the fifth pad 105, respectively, and thus, the fourth resistance measuring unit 240 may be electrically connected to the first pad 101 and the fifth pad 105. The first pad 101 may be electrically connected to the first crack detection electrode CDE1, and the fifth pad 105 may be electrically connected to the second crack detection electrode CDE2. Thus, an output resistance value of at least one of the first crack detection electrode CDE1 and the second crack detection electrode CDE2 may be measured by the fourth resistance measuring unit 240.

The fifth resistance measuring unit 250 may be electrically connected to the fourth terminal 204 and the sixth terminal 206. The fourth terminal 204 and the sixth terminal 206 are connected to the fourth pad 104 and the sixth pad 106, respectively, and thus, the fifth resistance measuring unit 250 may be electrically connected to the fourth pad 104 and the sixth pad 106. The fourth pad 104 may be electrically connected to the second auxiliary electrode SE2, and the sixth pad 106 may be electrically connected to the fourth crack detection electrode CDE4. Thus, an output resistance value of at least one of the fourth crack detection electrode CDE4 and the second auxiliary electrode SE2 may be measured by the fifth resistance measuring unit 250.

The sixth resistance measuring unit 260 may be electrically connected to the third terminal 203 and the sixth terminal 206. The third terminal 203 and the sixth terminal 206 are connected to the third pad 103 and the sixth pad 106, respectively, and thus, the sixth resistance measuring unit 260 may be electrically connected to the third pad 103 and the sixth pad 106. The third pad 103 may be electrically connected to the third crack detection electrode CDE3, and the sixth pad 106 may be electrically connected to the fourth crack detection electrode CDE4. Thus, an output resistance value of at least one of the third crack detection electrode CDE3 and the fourth crack detection electrode CDE4 may be measured by the sixth resistance measuring unit 260.

As illustrated in FIG. 15, the driving chip 20'' includes the first to sixth resistance measuring units 210, 220, 230, 240, 250, and 260, but some of the first to sixth resistance measuring units 210, 220, 230, 240, 250, and 260 may be omitted.

Figure 16:
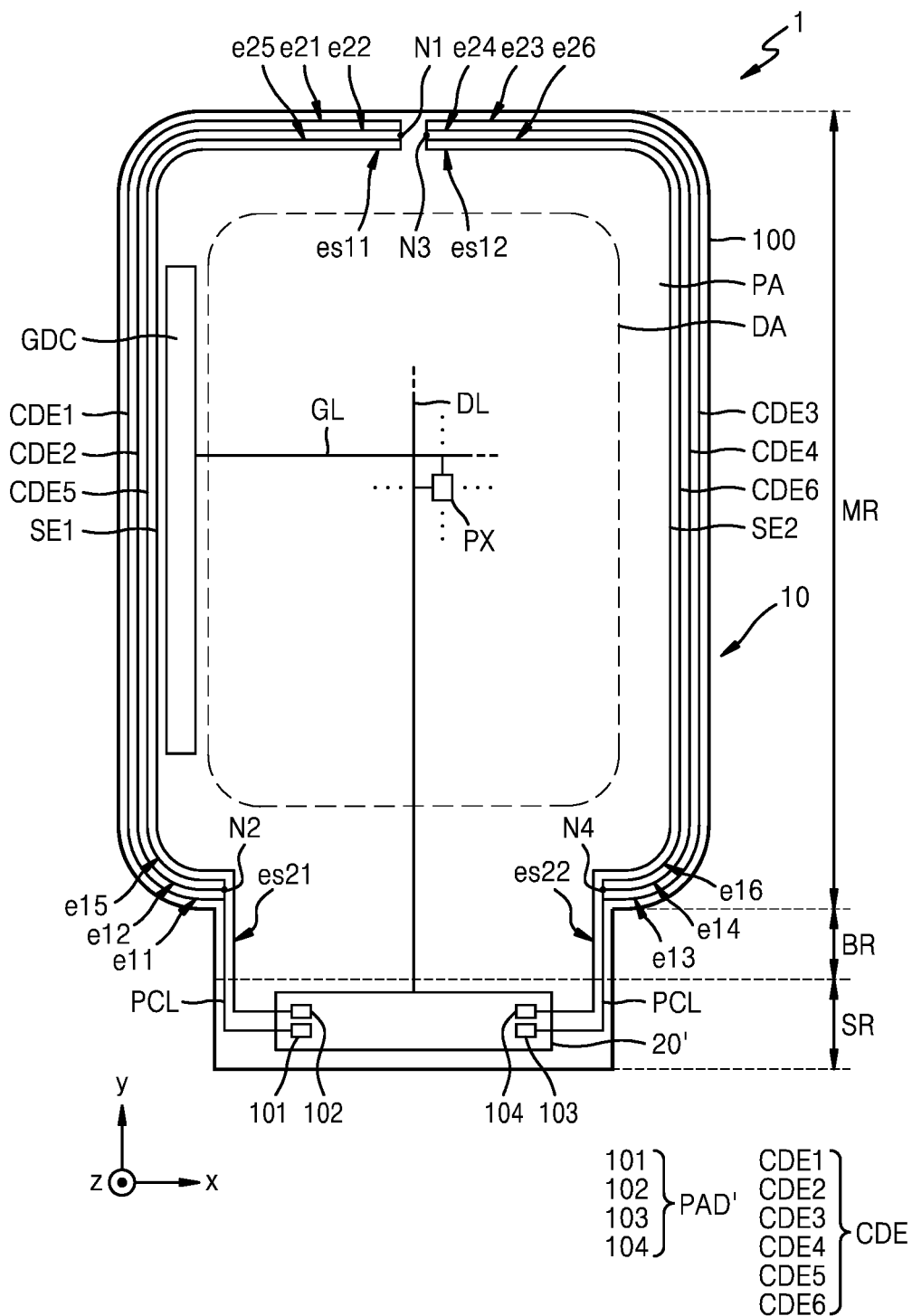
FIG. 16 is a plan view schematically illustrating a display apparatus according to another embodiment.
Figure 17:
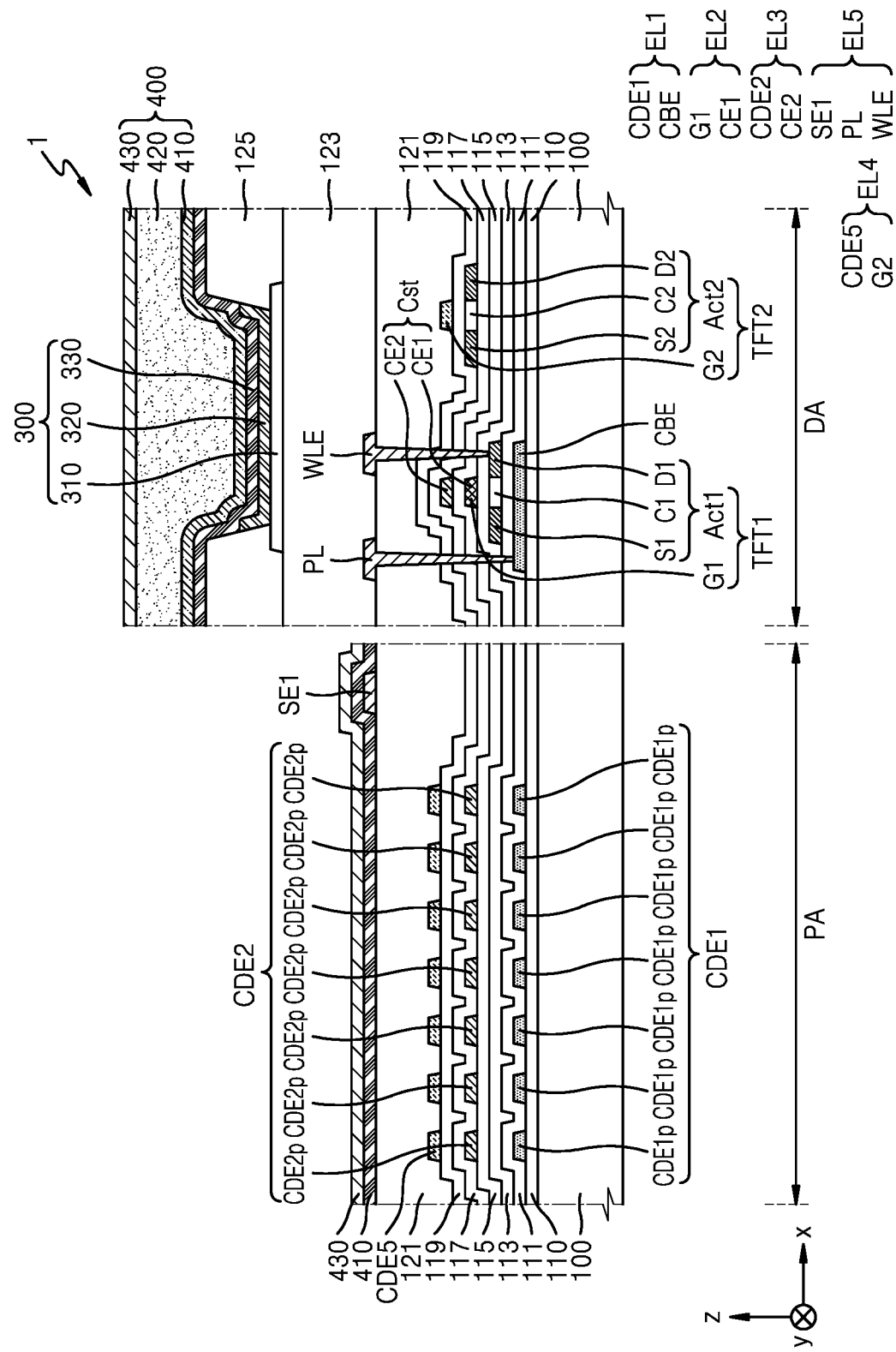
FIG. 17 is a cross-sectional view schematically illustrating the display apparatus of FIG. 16.

FIG. 16 is a plan view schematically illustrating a display apparatus according to another embodiment, and FIG. 17 is a cross-sectional view schematically illustrating the display apparatus of FIG. 16. FIGS. 16 and 17 illustrate modified embodiments of FIGS. 12 and 6, respectively, and FIGS. 16 and 17 differ from FIGS. 12 and 6 in terms of a structure of a crack detection electrode. Descriptions of FIGS. 16 and 17 that overlap those of FIGS. 12 and 6 will be omitted, and only differences will be mainly described below.

Referring to FIG. 16, the display panel 10 may further include a fifth crack detection electrode CDE5 and a sixth crack detection electrode CDE6 in the peripheral area PA. The fifth crack detection electrode CDE5 may extend along one edge (for example, a left edge) of the display panel 10, and the sixth crack detection electrode CDE6 may extend along the other edge (for example, a right edge) of the display panel 10.

In addition, the fifth crack detection electrode CDE5 may have a first end portion e15 electrically connected to the pad portion PAD', and a second end portion e25 located on the other side (for example, an upper side or an upper end portion) of the peripheral area PA. The sixth crack detection electrode CDE6 may have a first end portion e16 electrically connected to the pad portion PAD', and a second end portion e26 located on the other side of the peripheral area PA.

In this case, the second end portion e21 of the first crack detection electrode CDE1, the second end portion e22 of the second crack detection electrode CDE2, the first end portion es11 of the first auxiliary electrode SE1, and the second end portion e25 of the fifth crack detection electrode CDE5 may be connected to one another at the first node N1. The second end portion e23 of the third crack detection electrode CDE3, the second end portion e24 of the fourth crack detection electrode CDE4, the first end portion es12 of the second auxiliary electrode SE2, and the second end portion e26 of the sixth crack detection electrode CDE6 may be connected to one another at the third node N3. The first node N1 and the third node N3 are located on the other side of the peripheral area PA, and may be adjacent to each other.

The first end portion e11 of the first crack detection electrode CDE1 may be electrically connected to the first pad 101, the first end portion e12 of the second crack detection electrode CDE2 may be electrically connected to the first pad 101, the second end portion es21 of the first auxiliary electrode SE1 may be electrically connected to the second pad 102, and the first end portion e15 of the fifth crack detection electrode CDE5 may be electrically connected to the first pad 101.

As illustrated in FIG. 16, the first end portion e11 of the first crack detection electrode CDE1, the first end portion e12 of the second crack detection electrode CDE2, and the first end portion e15 of the fifth crack detection electrode CDE5 are electrically connected to a same pad, that is, the first pad 101, but in another example, the first end portion e11 of the first crack detection electrode CDE1, the first end portion e12 of the second crack detection electrode CDE2, and the first end portion e15 of the fifth crack detection electrode CDE5 may be electrically connected to different pads, respectively. This will be described below with reference to FIG. 18.

In another example, as described above with reference to FIG. 14, the first end portion e11 of the first crack detection electrode CDE1 and the first end portion e12 of the second crack detection electrode CDE2 may be electrically connected to different pads, respectively, and the first end portion e15 of the fifth crack detection electrode CDE5 may be connected to a pad connected to the first crack detection electrode CDE1 or a pad connected to the second crack detection electrode CDE2.

In an embodiment, the first end portion e11 of the first crack detection electrode CDE1, the first end portion e12 of the second crack detection electrode CDE2, and the first end portion e15 of the fifth crack detection electrode CDE5 may be connected to each other at the second node N2. In this case, the pad connection line PCL connected to the second node N2 may connect the first crack detection electrode CDE1, the second crack detection electrode CDE2, and the fifth crack detection electrode CDE5 to the first pad 101. In another example, the second node N2 may be omitted, and the first end portion e11 of the first crack detection electrode CDE1, the first end portion e12 of the second crack detection electrode CDE2, and the first end portion e15 of the fifth crack detection electrode CDE5 may be directly connected to the first pad 101.

The first end portion e13 of the third crack detection electrode CDE3 may be electrically connected to the third pad 103, the first end portion e14 of the fourth crack detection electrode CDE4 may be electrically connected to the third pad 103, and the second end portion es22 of the second auxiliary electrode SE2 may be electrically connected to the fourth pad 104, and the first end portion e16 of the sixth crack detection electrode CDE6 may be electrically connected to the third pad 103.

In FIG. 16, the first end portion e13 of the third crack detection electrode CDE3, the first end portion e14 of the fourth crack detection electrode CDE4, and the first end portion e16 of the sixth crack detection electrode CDE6 are electrically connected to a same pad, that is, the third pad 103, but in another embodiment, the first end portion e13 of the third crack detection electrode CDE3, the first end portion e14 of the fourth crack detection electrode CDE4, and the first end portion e16 of the sixth crack detection electrode CDE6 may be electrically connected to different pads, respectively. This will be described later with reference to FIG. 18.

In another example, as described above with reference to FIG. 14, the first end portion e13 of the third crack detection electrode CDE3 and the first end portion e14 of the fourth crack detection electrode CDE4 may be electrically connected to different pads, respectively, and the first end portion e16 of the sixth crack detection electrode CDE6 may be connected to a pad connected to the third crack detection electrode CDE3 or a pad connected to the fourth crack detection electrode CDE4.

In an embodiment, the first end portion e13 of the third crack detection electrode CDE3, the first end portion e14 of the fourth crack detection electrode CDE4, and the first end portion e16 of the sixth crack detection electrode CDE6 may be connected to one another at the fourth node N4. In this case, the pad connection line PCL connected to the fourth node N4 may connect the third crack detection electrode CDE3, the fourth crack detection electrode CDE4, and the sixth crack detection electrode CDE6 to the third pad 103. In another example, the fourth node N4 may be omitted, and the first end portion e13 of the third crack detection electrode CDE3, the first end portion e14 of the fourth crack detection electrode CDE4, and the first end portion e16 of the sixth crack detection electrode CDE6 may be directly connected to the third pad 103.

In an embodiment, as illustrated in FIG. 17, the first crack detection electrode CDE1, the second crack detection electrode CDE2, and the fifth crack detection electrode CDE5 may overlap one another. In FIG. 17, the first crack detection electrode CDE1, the second crack detection electrode CDE2, and the fifth crack detection electrode CDE5 completely overlap one another, but embodiments are not limited thereto. The first crack detection electrode CDE1, the second crack detection electrode CDE2, and the fifth crack detection electrode CDE5 may partially overlap one another.

Meanwhile, as described above with reference to FIG. 5, the first crack detection electrode CDE1 and the second crack detection electrode CDE2 may include a plurality of zigzag patterns that are connected to each other in series. The fifth crack detection electrode CDE5 may also include a plurality of zigzag patterns that are connected to each other in series.

As illustrated in FIG. 17, the fifth crack detection electrode CDE5 may be disposed over the third gate insulating layer 119. In other words, the fifth crack detection electrode CDE5 may be disposed on a same layer as the second gate electrode G2, and the fifth crack detection electrode CDE5 may include a same material as the second gate electrode G2. The fifth crack detection electrode CDE5 may be included in the fourth conductive layer EL4. Although the above descriptions are made based on the fifth crack detection electrode CDE5, it may also be applied in a same manner to the sixth crack detection electrode CDE6.

As described above, when the fifth crack detection electrode CDE5 and the sixth crack detection electrode CDE6 are further arranged at an outer periphery of the display panel 10, damage to the display panel 10 and/or the display apparatus 1 may be accurately detected in a broader range. The fifth crack detection electrode CDE5 and the sixth crack detection electrode CDE6 are electrically connected to the first pad 101 and the third pad 103, respectively, and thus, an output resistance value of each of the fifth crack detection electrode CDE5 and the sixth crack detection electrode CDE6 may be measured by using the driving chip 20' illustrated in FIG. 13.

Figure 18:
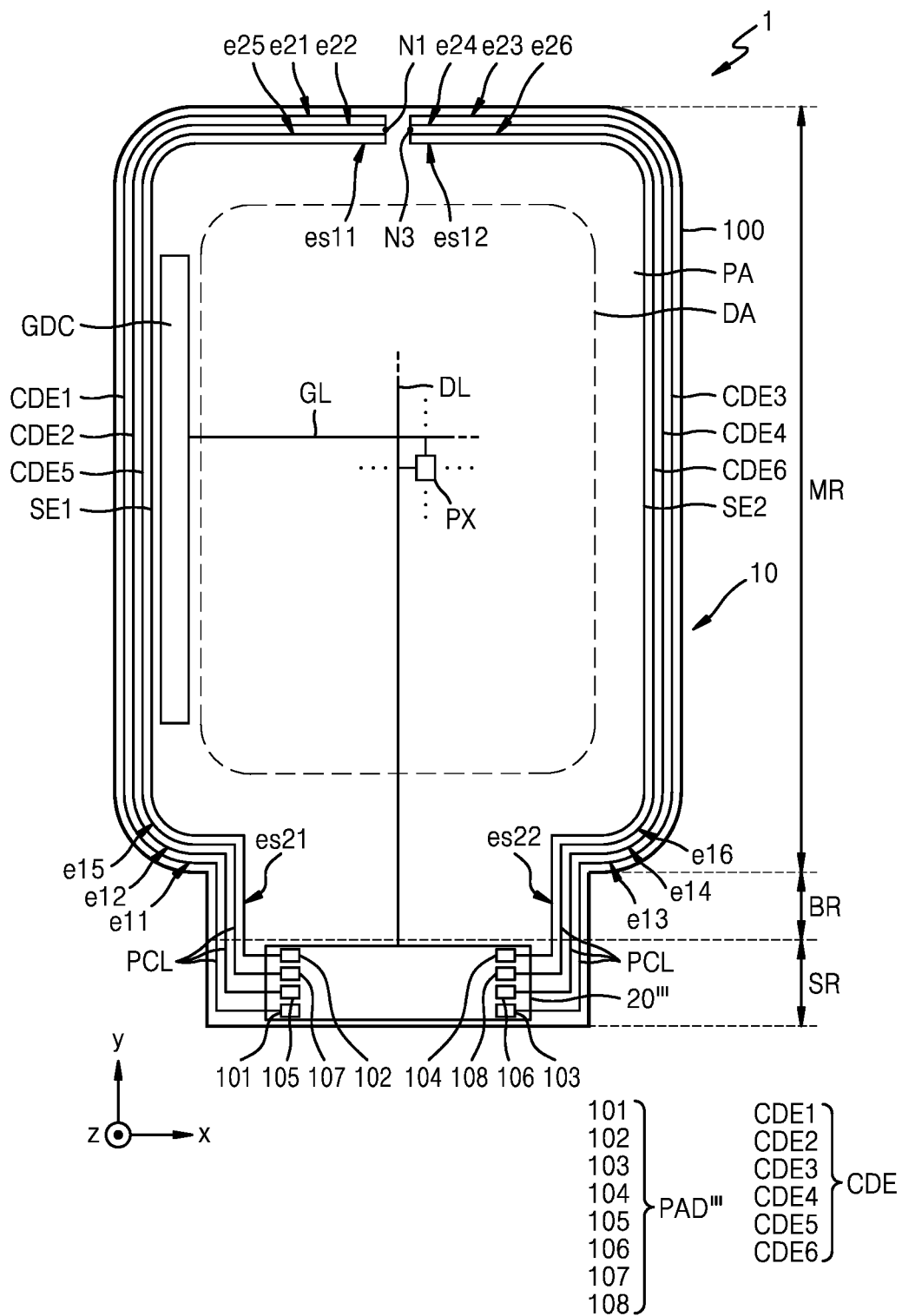
FIG. 18 is a plan view schematically illustrating a display apparatus according to another embodiment.

FIG. 18 is a plan view schematically illustrating a display apparatus according to another embodiment. FIG. 18 illustrates a modified embodiment of FIGS. 14 and 16, and FIG. 18 differs from FIGS. 14 and 16 with respect to a connection structure between a crack detection electrode and a pad portion. Descriptions of FIG. 18 that overlap those of FIGS. 14 and 16 will be omitted, and only differences will be mainly described below.

In FIG. 16, the first end portion e11 of the first crack detection electrode CDE1, the first end portion e12 of the second crack detection electrode CDE2, and the first end portion e15 of the fifth crack detection electrode CDE5 are electrically connected to a same pad, that is, the first pad 101, but referring to FIG. 18, the first end portion e11 of the first crack detection electrode CDE1, the first end portion e12 of the second crack detection electrode CDE2, and the first end portion e15 of the fifth crack detection electrode CDE5 may be electrically connected to different pads, respectively.

For example, as illustrated in FIG. 18, a pad portion PAD''' may further include the fifth pad 105 and a seventh pad 107. The first end portion e11 of the first crack detection electrode CDE1 may be electrically connected to the first pad 101, the first end portion e12 of the second crack detection electrode CDE2 may be electrically connected to the fifth pad 105, and the first end portion e15 of the fifth crack detection electrode CDE5 may be connected to the seventh pad 107.

Although descriptions are provided based on the first crack detection electrode CDE1, the second crack detection electrode CDE2, and the fifth crack detection electrode CDE5, the same descriptions may also be applied in a same manner to the third crack detection electrode CDE3, the fourth crack detection electrode CDE4, and the sixth crack detection electrode CDE6. In other words, the pad portion PAD''' may further include the sixth pad 106 and an eighth pad 108. The first end portion e13 of the third crack detection electrode CDE3 may be electrically connected to the third pad 103, the first end portion e14 of the fourth crack detection electrode CDE4 may be electrically connected to the sixth pad 106, and the first end portion e16 of the sixth crack detection electrode CDE6 may be electrically connected to the eighth pad 108.

Meanwhile, as the pad portion PAD''' further includes the fifth pad 105, the sixth pad 106, the seventh pad 107, and the eighth pad 108, a driving chip 20''' may further include terminals and resistance measuring units.

Although the display apparatus has been described, the disclosure is not limited thereto. For example, it may be understood that methods of manufacturing the display apparatus also fall within the scope of the disclosure.

According to an embodiment as described above, a display apparatus with increased crack detection range may be implemented. However, the scope of the inventive concepts are not limited by this effect.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display apparatus comprising:
   a substrate having a display area and a peripheral area outside the display area;
   a first pad at one side of the peripheral area;
   a first semiconductor layer disposed on the display area;
   a first conductive layer interposed between the substrate and the first semiconductor layer, and includes a first electrode on the display area, and a first crack detection electrode, the first crack detection electrode including a first end portion at the one side of the peripheral area and a second end portion at another side of the peripheral area;
   a second conductive layer disposed on the first semiconductor layer, and includes a second electrode at least partially overlapping the first semiconductor layer, and a second crack detection electrode, the second crack detection electrode including a first end portion located at the one side of the peripheral area and a second end portion connected to the second end portion of the first crack detection electrode; and
   a third conductive layer disposed on the second conductive layer, and includes a third electrode on the display area, and a first auxiliary electrode, the first auxiliary electrode including a first end portion connected to the second end portion of the first crack detection electrode and a second end portion electrically connected to the first pad.

2. The display apparatus of claim 1, further including a first voltage line electrically connected to the first end portion of the first crack detection electrode and the first end portion of the second crack detection electrode.

3. The display apparatus of claim 2, further comprising:
a second voltage line electrically connected to the first pad;
a first data line and a second data line that are disposed on the display area and extend in a first direction;
a first switch connected between the first voltage line and the first data line; and
a second switch connected between the second voltage line and the second data line.

4. The display apparatus of claim 3, wherein the first switch and the second switch are simultaneously controlled.

5. The display apparatus of claim 1, further comprising:
a first voltage line electrically connected to the first end portion of the first crack detection electrode; and
a second voltage line electrically connected to the first end portion of the second crack detection electrode.

6. The display apparatus of claim 5, further comprising:
a third voltage line electrically connected to the first pad;
first to third data lines that are disposed on the display area and extend in a first direction;
a first switch connected between the first voltage line and the first data line;
a second switch connected between the second voltage line and the second data line; and
a third switch connected between the third voltage line and the third data line.

7. The display apparatus of claim 6, wherein the first switch, the second switch, and the third switch are simultaneously controlled.

8. The display apparatus of claim 1, further comprising:
a second pad electrically connected to the first end portion of the first crack detection electrode and the first end portion of the second crack detection electrode.

9. The display apparatus of claim 8, further comprising:
a resistance measuring unit electrically connected to the first pad and the second pad.

10. The display apparatus of claim 1, further comprising:
a second pad electrically connected to the first end portion of the first crack detection electrode; and
a third pad electrically connected to the first end portion of the second crack detection electrode.

11. The display apparatus of claim 1, wherein the first crack detection electrode extends along one edge of the substrate in the peripheral area,
the second crack detection electrode extends along the one edge in the peripheral area, and
the first auxiliary electrode extends along the one edge in the peripheral area.

12. The display apparatus of claim 1, wherein the second crack detection electrode at least partially overlaps the first crack detection electrode.

13. The display apparatus of claim 1, further comprising:
a semiconductor pattern having a first conductive region, a channel region, and a second conductive region;
a channel bottom electrode that overlaps the channel region, and is configured to receive a driving voltage;
a gate electrode overlapping the channel region;
an upper electrode overlapping the gate electrode; and
a line electrode electrically connected to one of the first conductive region and the second conductive region,
wherein the first semiconductor layer includes the semiconductor pattern,
the first conductive layer includes the channel bottom electrode,
the second conductive layer includes the gate electrode or the upper electrode, and
the third conductive layer includes the line electrode.

14. The display apparatus of claim 1, further comprising:
a second semiconductor layer disposed on the second conductive layer in the display area; and
a fourth conductive layer interposed between the second semiconductor layer and the third conductive layer, and includes a fourth electrode overlapping a channel region of the second semiconductor layer, and a third crack detection electrode, the third crack detection electrode including a first end portion at the one side of the peripheral area and a second end portion connected to the second end portion of the first crack detection electrode and the first end portion of the first auxiliary electrode.

15. The display apparatus of claim 14, further comprising:
a second pad electrically connected to the first end portion of the first crack detection electrode, the first end portion of the second crack detection electrode, and the first end portion of the third crack detection electrode.

16. The display apparatus of claim 14, further comprising:
a second pad electrically connected to the first end portion of the first crack detection electrode;
a third pad electrically connected to the first end portion of the second crack detection electrode; and
a fourth pad electrically connected to the first end portion of the third crack detection electrode.

17. The display apparatus of claim 14, wherein the first semiconductor layer includes a silicon semiconductor material, and the second semiconductor layer includes an oxide semiconductor material.

18. The display apparatus of claim 1, wherein the first end portion of the first auxiliary electrode is directly connected to the second end portion of the first crack detection electrode and the second end portion of the second crack detection electrode through contact plugs.

19. The display apparatus of claim 1, wherein at least one of the first crack detection electrode and the second crack detection electrode includes a plurality of zigzag patterns that are connected to each other in series.

20. The display apparatus of claim 1, further comprising:
a second pad disposed at the one side of the peripheral area,
wherein the first conductive layer further includes a third crack detection electrode that includes a first end portion at the one side of the peripheral area and a second end portion adjacent to the second end portion of the first crack detection electrode on the other side of the peripheral area,
the second conductive layer further includes a fourth crack detection electrode that includes a first end portion at the one side of the peripheral area and a second end portion connected to the second end portion of the third crack detection electrode, and
the third conductive layer further includes a second auxiliary electrode that includes a first end portion connected to the second end portion of the third crack detection electrode and a second end portion electrically connected to the second pad.

21. The display apparatus of claim 20, wherein each of the first crack detection electrode, the second crack detection electrode, and the first auxiliary electrode extends along one edge of the substrate, each of the third crack detection electrode, the fourth crack detection electrode, and the second auxiliary electrode extends along another edge of the substrate, and the one edge of the substrate and the other edge of the substrate are opposite to each other.

22. The display apparatus of claim 20, further comprising:
a first voltage line electrically connected to the first end portion of the first crack detection electrode and the first end portion of the second crack detection electrode; and
a second voltage line electrically connected to the first end portion of the third crack detection electrode and the first end portion of the fourth crack detection electrode.

23. The display apparatus of claim 22, further comprising:
a third voltage line electrically connected to the first pad;
a fourth voltage line electrically connected to the second pad;
first to fourth data lines that are disposed on the display area and extend in a first direction;
a first switch connected between the first voltage line and the first data line;
a second switch connected between the second voltage line and the second data line;
a third switch connected between the third voltage line and the third data line; and
a fourth switch connected between the fourth voltage line and the fourth data line.

24. The display apparatus of claim 23, wherein the first to fourth switches are simultaneously controlled.

25. The display apparatus of claim 20, further comprising:
a first voltage line electrically connected to the first end portion of the first crack detection electrode;
a second voltage line electrically connected to the first end portion of the second crack detection electrode;
a third voltage line electrically connected to the first end portion of the third crack detection electrode; and
a fourth voltage line electrically connected to the first end portion of the fourth crack detection electrode.

26. The display apparatus of claim 25, further comprising:
a fifth voltage line electrically connected to the first pad;
a sixth voltage line electrically connected to the second pad;
first to sixth data lines that are disposed on the display area and extend in a first direction;
a first switch connected between the first voltage line and the first data line;
a second switch connected between the second voltage line and the second data line;
a third switch connected between the third voltage line and the third data line;
a fourth switch connected between the fourth voltage line and the fourth data line;
a fifth switch connected between the fifth voltage line and the fifth data line; and
a sixth switch connected between the sixth voltage line and the sixth data line.

27. The display apparatus of claim 26, wherein the first to sixth switches are simultaneously controlled.

* * * * *